US006913942B2

(12) United States Patent
Patel et al.

(10) Patent No.: US 6,913,942 B2
(45) Date of Patent: Jul. 5, 2005

(54) SACRIFICIAL LAYERS FOR USE IN FABRICATIONS OF MICROELECTROMECHANICAL DEVICES

(75) Inventors: Satyadev R. Patel, Elk Grove, CA (US); Jonathan C. Doan, Mountain View, CA (US)

(73) Assignee: Reflectvity, Inc, Sunnyvale, CA (US)

( * ) Notice: Subject to any disclaimer, the term of this patent is extended or adjusted under 35 U.S.C. 154(b) by 120 days.

(21) Appl. No.: 10/402,889

(22) Filed: Mar. 28, 2003

(65) Prior Publication Data

US 2004/0191946 A1 Sep. 30, 2004

(51) Int. Cl.⁷ ............................................... H01L 21/00
(52) U.S. Cl. .............................. 438/48; 438/50; 438/53
(58) Field of Search ..................................... 438/48–56

(56) References Cited

U.S. PATENT DOCUMENTS

| 3,511,727 A | 5/1970 | Hays |
| 4,190,488 A | 2/1980 | Winters |
| 4,310,380 A | 1/1982 | Flamm et al. |
| 4,498,953 A | 2/1985 | Cook et al. |

(Continued)

FOREIGN PATENT DOCUMENTS

| EP | 0704884 A2 | 4/1996 |
| EP | 0822582 A2 | 2/1998 |
| EP | 0822584 A2 | 4/1998 |
| EP | 0878824 A2 | 11/1998 |
| EP | 0878824 A3 | 1/2000 |
| JP | 1982/57098679 A | 6/1982 |
| JP | 1983/58130529 A | 8/1983 |
| JP | 1985/60057938 A | 4/1985 |
| JP | 1986/61053732 A | 3/1986 |
| JP | 1986/61134019 A | 6/1986 |
| JP | 1986/61181131 A | 8/1986 |
| JP | 1986/61187238 A | 8/1986 |
| JP | 1986/61270830 A | 12/1986 |
| JP | 1987/62071217 A | 4/1987 |
| JP | 1988/63155713 A | 6/1988 |
| JP | 1989/01208834 A | 8/1989 |
| JP | 1989/10217921 A | 8/1989 |
| JP | 1990/02250323 A | 10/1990 |
| JP | 1991/03012921 A | 1/1991 |
| JP | 1992/04096222 A | 3/1992 |
| JP | 1995/07029823 A | 1/1995 |
| JP | 1997/09251981 A | 9/1997 |
| JP | 1998/10313128 A | 11/1998 |
| JP | 1998/10317169 A | 12/1998 |
| WO | WO-98/32163 | 7/1998 |
| WO | WO-99/49506 | 9/1999 |

OTHER PUBLICATIONS

Aliev et al., "Development of Si(100) Surface Roughness at the Initial Stage of Etching in F2 and XeF2 Gases Ellipsometric Study", Surface Science 442 (1999), pp. 206–214.

Glidemeister, J.M., "Xenon Difluoride Etching System" (Nov. 17, 1997).

(Continued)

*Primary Examiner*—H. Jey Tsai
(74) *Attorney, Agent, or Firm*—Gregory R. Muir

(57) ABSTRACT

A sacrificial layer and a method for applying said sacrificial layer in fabricating microelectromechanical devices are disclosed herein. The sacrificial layer comprises an early transition metal. Specifically, the sacrificial layer comprises an early transition metal element, an early transition metal alloy or an early transition metal silicide.

53 Claims, 10 Drawing Sheets

U.S. PATENT DOCUMENTS

| | | | |
|---|---|---|---|
| 5,439,553 | A | 8/1995 | Grant et al. |
| 5,726,480 | A | 3/1998 | Pister |
| 5,835,256 | A | 11/1998 | Huibers |
| 6,051,503 | A | 4/2000 | Bhardwaj |
| 6,115,172 | A | 9/2000 | Jeong |
| 6,162,367 | A | 12/2000 | Tai et al. |
| 6,197,610 | B1 | 3/2001 | Toda |
| 6,204,080 | B1 | 3/2001 | Hwang |
| 6,238,581 | B1 | 5/2001 | Hawkins et al. |
| 6,290,864 | B1 | 9/2001 | Patel et al. |
| 6,355,181 | B1 | 3/2002 | McQuarrie |
| 6,396,619 | B1 | 5/2002 | Huibers et al. |
| 6,409,876 | B1 | 6/2002 | McQuarrie et al. |
| 6,436,229 | B2 | 8/2002 | Tai et al. |
| 6,500,356 | B2 | 12/2002 | Goto et al. |
| 6,576,489 | B2 | 6/2003 | Leung et al. |
| 2001/0002663 | A1 | 6/2001 | Tai et al. |
| 2002/0015215 | A1 * | 2/2002 | Miles .................... 359/290 |
| 2002/0033229 | A1 | 3/2002 | Lebouitz et al. |
| 2002/0047172 | A1 | 4/2002 | Reid |
| 2002/0121502 | A1 | 9/2002 | Patel et al. |
| 2002/0163051 | A1 | 11/2002 | Gopal et al. |
| 2002/0164879 | A1 | 11/2002 | Leung et al. |
| 2002/0185699 | A1 | 12/2002 | Reid |
| 2002/0196524 | A1 | 12/2002 | Huibers et al. |
| 2003/0054588 | A1 | 3/2003 | Patel et al. |
| 2003/0071015 | A1 | 4/2003 | Chinn et al. |
| 2003/0077878 | A1 | 4/2003 | Kumar et al. |
| 2003/0124848 | A1 | 7/2003 | Chinn et al. |
| 2003/0166342 | A1 | 9/2003 | Chinn et al. |
| 2003/0219986 | A1 | 11/2003 | Rattner et al. |
| 2004/0014253 | A1 * | 1/2004 | Gupta et al. .................. 438/48 |

OTHER PUBLICATIONS

Habuka et al., "Dominant Overall Chemical Reaction in a Chlorine Trifluoride–Silicon–Nitrogen System at Atmospheric Pressure", Japan Journal of Applied Physics vol. 38 (1999), pp. 6466–6469.

Hecht et al., "A Novel X–ray Photoelectron Spectroscopy Study of the Al/SiO2 Interface", J. Appl. Phys. vol. 57 (Jun. 15, 1985), pp. 5256–5261.

Houle, F.A., "Dynamics of SiF4 Desorption During Etching of Silicon by XeF2", IBM Almaden Research Center (Apr. 15, 1987), pp. 1866–1872.

Flamm et al., "XeF2 and F–Atom Reactions with Si: Their Significance for Plasma Etching", Solid State Technol. 26, 117 (1983).

Ibbotson et al., "Plasmaless Dry Etching of Silicon with Fluorine–containing Compounds", J. Appl. Phys. vol. 56 No. 10 (Nov. 1984), pp. 2939–2942.

Ibbotson et al., "Comparison of XeF2 and F–atom Reactions with Si and SiO2", Applied Physics Letter, vol. 44, 1129 (1984).

Streller et al., "Selectivity in Dry Etching of Si (100) and XeF2 and VuV Light", Elsevier Science B.V., Applied Surface Science vol. 106 (1996), pp. 341–346.

Vugts et al., "Si/XeF2 Etching: Temperature Dependence", J. Vac. Sci. Technol. A 14(5) (Sep./Oct. 1996), pp. 2766–2774.

Winters, H.F., "Etch Products from the Reaction of XeF2 with SiO2, SiO3, Si3N4, Sic, and Si in the Presence of Ion Bombardment", J. Vac. Sci. Technol. B 1(4) (Oct./Dec. 1983), pp. 927–931.

Kurt Williams, Etch Rates for Micromachining Processing–Part II, 2003 IEEE, pp. 761–778, Journal of Microelectromechanical Systems, vol. 12, No. 6, Dec. 2003.

Winters et al., "The Etching of Silicon with XeF2 Vapor", Appl. Phys. Letter, vol. 34(1) (Jan. 1, 1979), pp. 70–73.

Xactix, Inc., Marketing Brochure (Jun. 27, 1999).

"Xenon Difluoride Isotropic Etch System: Seeing is Believing", Surface Technology Systems Ltd. brochure, Newport, UK, date unknown.

Chu et al., "Controlled Pulse–Etching with Xenon Difluoride", International Solid State Sensors and Actuators Conference (Transducers '97), Chicago, IL, vol. 1 (Jun. 16–19, 1997), pp. 665–668 (abstract only).

Bassom et al., "Modeling and Optimizing XeF2–enhanced FIB Milling of Silicon", 25th International Symposium for Testing and Failure Analysis, Santa Clara, CA (Nov. 14–18, 1999), pp. 255–261 (abstract only).

Kohler et al., "Fabrication of Microlenses by Plasmaless Isotropic Etching Combined with Plastic Moulding", Sens. Actuators A, Phys. (Switzerland), vol. A53, No. 1–3 (May 1996), pp. 361–363 (abstract only).

Chan et al., "Gas Phase Pulse Etching of Silicon for MEMS with Xenon Difluoride", Engineering Solutions for the Next Millenium: 1999 IEEE Canadian Conference on Electrical and Computer Engineering, Edmonton, Alberta, vol. 3 (May 9–12, 1999), pp. 1637–1642 (abstract only).

Chang et al., "Gas–Phase Silicon Micromachining with Silicon Difluoride", Proceeding of the SPIE—The International Socity for Optical Engineering, vol. 2641 (1995), pp. 117–128 (abstract only).

Sebel et al., "Reaction Layer Dynamics in Ion–Assisted Si/XeF2 Etching: Temperature Dependence", J. Vac. Sci. Technol. A, Vac. Surf. Films, vol. 18, No. 6, (Nov. 2000), pp. 2759–2769 (abstract only).

Sebel et al., "Silicon Etch Rate Enhancement by Traces of Metal", J. Vac. Sci. Technol. A, Vac. Surf. Films, vol. 17, No. 3, (May/Jun. 1999), pp. 755–762 (abstract only).

Sugano et al., "Study on XeF2 Pulse Etching Using Wagon Wheel Pattern", Proceedings of the 1999 International Symposium on Micromechantronics and Human Science: Towards the New Century, Nagoya, Japan (Nov. 23–26, 1999), pp. 163–167 (abstract only).

Wang et al., "Gas–Phase Silicon Etching with Bromine Trifluoride", International Solid State Sensors and Actuators Conference (Transducers '97), Chicago, IL, vol. 2 (Jun. 16–19, 1997), pp. 1505–1508 (abstract only).

Muthukumaran et al., "Gas–Phase Xenon Difluoride Etching of Microsystems Fabricated Through the Mitel 1.5–mu m CMOS Process", Can. J. Electr. Comput. Eng. (Canada), vol. 25, No. 1 (Jan. 2000), pp. 35–41.

Toda et al., "Thin Beam Bulk Micromachining Based on RIE and Xenon Difluoride Silicon Etching", International Solid State Sensors and Actuators Conference (Transducers '97), Chicago, IL, vol. 1 (Jun. 16–19, 1997), pp. 671–674.

Sebel et al., "Etching of Si Through a Thick Condensed XeF2 Layer", J. Vac. Sci. Technol. A, Vac. Surf. Films, vol. 18, No. 5 (Sep./Oct. 2000), pp. 2090–2097 (abstract only).

* cited by examiner

US 6,913,942 B2

SACRIFICIAL LAYERS FOR USE IN FABRICATIONS OF MICROELECTROMECHANICAL DEVICES

The present invention is related generally to microelectromechanical systems, and, more particularly, to fabrication of microelectromechanical systems using sacrificial layers.

In an embodiment of the invention, a method is disclosed. The method comprises: providing a substrate; depositing a sacrificial layer on the substrate; forming one or more structure layers of a microelectromechanical device after the sacrificial layer; removing the sacrificial layer for releasing the microelectromechanical device; and wherein the sacrificial layer comprises an early transition metal element, an early transition metal alloy or an early transition metal silicide.

As a feature of the embodiment, a barrier layer may be deposited on the structure layer formed on the sacrificial layer. Further structure layers of the micromechanical device can thus be formed on the barrier layer consecutively. Like the sacrificial layer, the barrier layer is removed during or after releasing the microelectromechanical device.

As another feature of the embodiment, a barrier layer may be deposited and then patterned on the structure layer formed on the sacrificial layer. Further structure layers of the micromechanical device are formed on the patterned barrier layer consecutively. Different from the sacrificial layer, the barrier layer is not removed after releasing the microelectromechanical device.

BRIEF DESCRIPTION OF DRAWINGS

While the appended claims set forth the features of the present invention with particularity, the invention, together with its objects and advantages, may be best understood from the following detailed description taken in conjunction with the accompanying drawings of which:

FIG. 8b presents an exemplary micromirror array comprising a plurality of micromirrors of FIG. 8a;

FIG. 9b is a back-view of a micromirror array comprising a plurality of micromirrors of FIG. 9a;

DETAILED DESCRIPTION OF THE EMBODIMENTS

The present invention provides a novel sacrificial layer for use in the fabrication of microelectromechanical devices (MEMS). In a fabrication process, a sacrificial layer is deposited on a substrate before forming structure layers of the MEMS device. Before depositing the sacrificial layer, the substrate may be coated with an anti-reflection film. The sacrificial layer comprises an early transition metal. Specifically, the early transition metal can be early transition metal element, early transition metal alloy or early transition metal silicide. The sacrificial layer is removed after releasing the MEMS device. It is also possible to have a barrier layer deposited on the formed structure layer that is formed on the sacrificial layer. After the barrier layer, other structure layers of the MEMS device are formed. The barrier layer may or may not be removed after releasing the MEMS device depending upon specific design of the MEMS structure. If the barrier layer is to be removed along with the sacrificial layer, the barrier layer is preferably the same as the sacrificial layer. Though preferred, the barrier layer may be different from the sacrificial layer. For example, the barrier layer can be amorphous silicon. If the barrier layer is not to be removed, the barrier layer may be patterned and kept along with the structure layers of the MEMS device.

Figure 1:
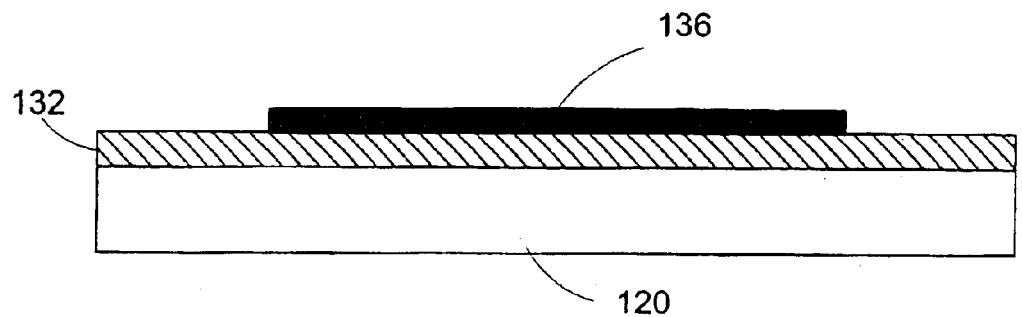
FIG. 1 is a cross-sectional view of a structure illustrating a sacrificial layer deposited between a substrate and a structure layer of a microelectromechanical device according to an embodiment of the invention.

Referring to FIG. 1, a sacrificial layer is deposited between a substrate and a structure layer of a MEMS device is illustrated therein. Specifically, sacrificial layer 132 is deposited on substrate 120, and structure layer 136 is formed on sacrificial layer 132. The sacrificial layer (e.g. layer 132) may comprise an early transition metal. The early transition metals are those elements in the periodic table in columns 3 through 7, namely columns beginning with Sc, Ti, V, Cr, and Mn. Preferred are those elements in columns 4 through 6 (i.e. Ti, Zr, Hf, V, Nb, Ta, Cr, Mo and W). However late transition metals in columns 8, 1 and 2 may also be possible in the present invention, though preferably in conjunction with an early transition metal. In particular, the sacrificial layer may comprise early transition metal element early transition metal alloy, or early transition metal silicide. The early transition metal alloy can be any suitable alloys of two or more early transition metal elements, such as tungsten titanium, tungsten molybdenum and tungsten tantalum. The early transition metal silicides can be any suitable silicides of one or more early transition metal elements or alloys, such as tungsten silicide, titanium silicide, molybdenum silicide and tungsten titanium silicide.

After deposition of the sacrificial layer, structure layer 136 of a MEMS device is deposited and patterned. After the completion of forming the structure layers of the MEMS device, the sacrificial layer (e.g. layer 132) is removed for releasing the MEMS device, which will be described later with reference to FIG. 10 through 13.

Figure 2:
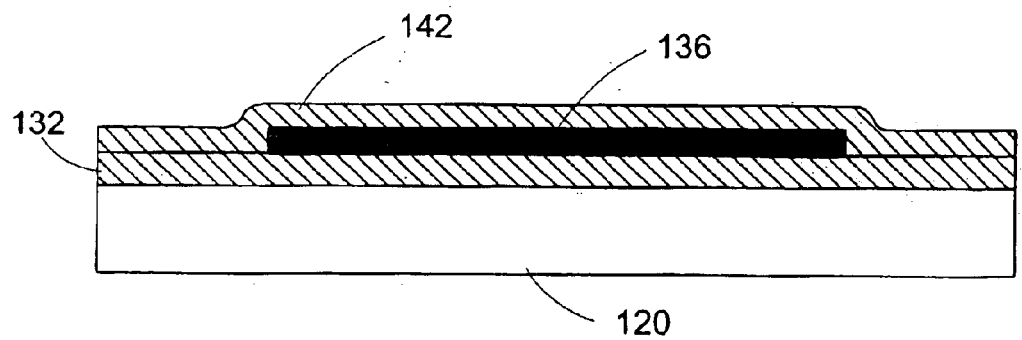
FIG. 2 is a cross-sectional view of a structure illustrating another sacrificial layer formed after the structure layer illustrated in FIG. 1 in accordance with a feature of the embodiment of the invention.

As an aspect of the embodiment, another sacrificial layer 142 is deposited after structure layer 136 for forming other structure layers of the MEMS device, as shown in FIG. 2. Similar to sacrificial layer 132, sacrificial layer 142 comprises an early transition metal, preferably an early transition metal within columns 4 through 6 in the periodic table (i.e. Ti, Xr, Hf, V, Nb, Ta, Cr, Mo and W). In particular, the sacrificial layer may comprise an early transition metal element, early transition metal alloy or early transition metal silicide. In the aspect of the embodiment, sacrificial layer 142 is removed along with sacrificial layer 132 by etching. Alternatively, sacrificial layer 142 is removed through a separate etching process from the etching step for sacrificial layer 132.

Figure 3:
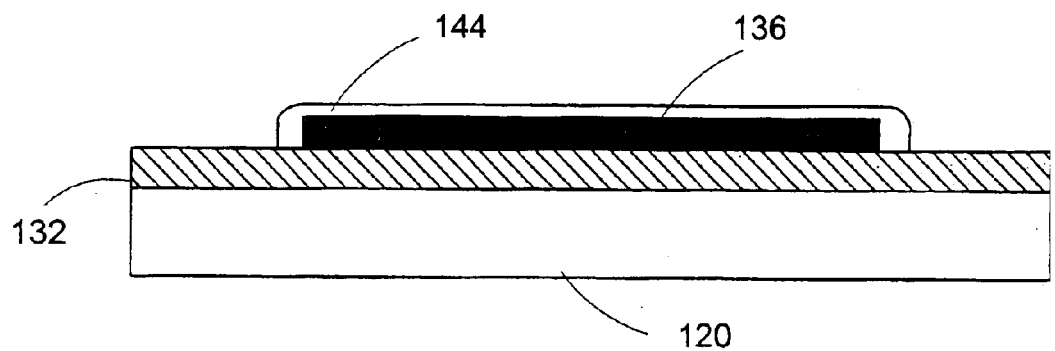
FIG. 3. is a cross-sectional view of a structure illustrating yet another sacrificial layer formed after the structure layer illustrated in FIG. 1 in accordance with another feature of the embodiment of the invention.

In another embodiment of the invention, a barrier layer may be deposited after structure layer. Referring to FIG. 3, barrier layer 144 is deposited after structure layer 136 and then patterned according to structure layer 136. The patterned barrier layer 144 remains with structure layer 136 after releasing (i.e. after removal of sacrificial layer 132). In this case, the barrier layer may act as a protection film for the structure layer in the interim.

As an exemplary implementation of the embodiments of the present invention, a fabrication process for a micromirror device used in display systems will be discussed in the following. It will be understood by those skills in the art that the following discussion of the fabrication process is for demonstration purposes only. It should not by any means be interpreted as a limitation. Instead, other suitable fabrication processes, such as those set forth in U.S. Pat. Nos. 5,835,256 and 6,046,840 both to Huibers, and U.S. patent application Ser. No. 10/366,297 filed on Feb. 12, 2003 to Patel, the subject matter of each being incorporated herein by reference, are also applicable. U.S. patent application Ser. Nos. 09/910,537 filed Jul. 20, 2001, and 60/300,533 filed Jun. 22, 2001 both to Reid, and U.S. patent application Ser. No. 10/176,478 to Reid filed on Jun. 21, 2002 contain examples of materials that may be used for the various components of the current invention. These U.S. patent applications are incorporated herein by reference.

Figure 4A:
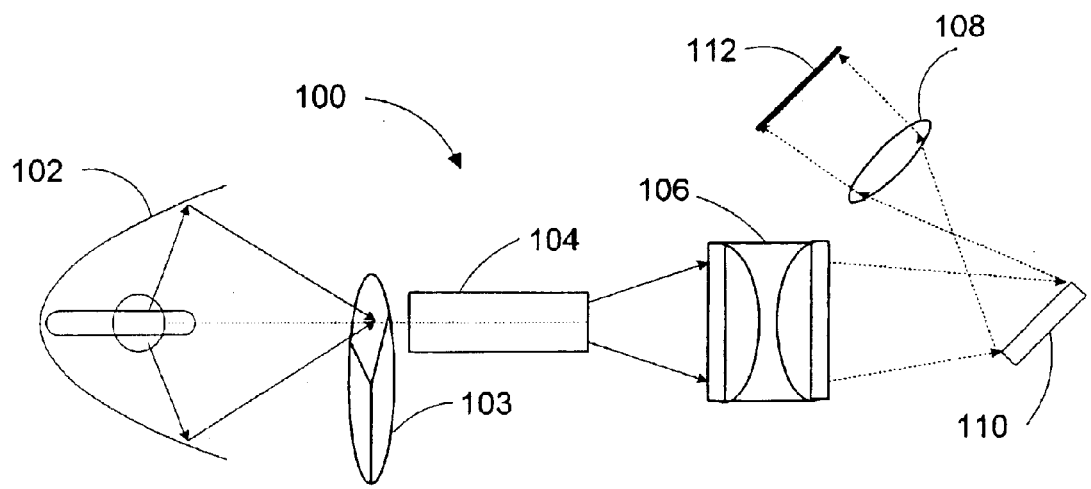
FIG. 4a is diagram illustrating an exemplary display system employing a spatial light modulator.

Referring to FIG. 4a, a typical display system employing a spatial light modulator that comprises a plurality of micromirror devices of FIG. 1 is illustrated herein. In its very basic configuration, the display system comprises light source 102, optical devices (e.g. light pipe 104, lens 106 and 108), color wheel 103, display target 112 and spatial light modulator 110. Light source 102 (e.g. an arc lamp) directs incident light through the color wheel and optical devices (e.g. light pipe 104 and object lens 106) and shines on spatial light modulator 110. Spatial light modulator 110 selectively reflects the incident light toward optical device 108 and results in an image on display target 112. The display system can be operated in many ways, such as those set forth in U.S. Pat. No. 6,388,661, and U.S. patent application Ser. No. 10/340,162, filed on Jan. 10, 2003, both to Richards, the subject matter of each being incorporated herein by reference.

Figure 4B:
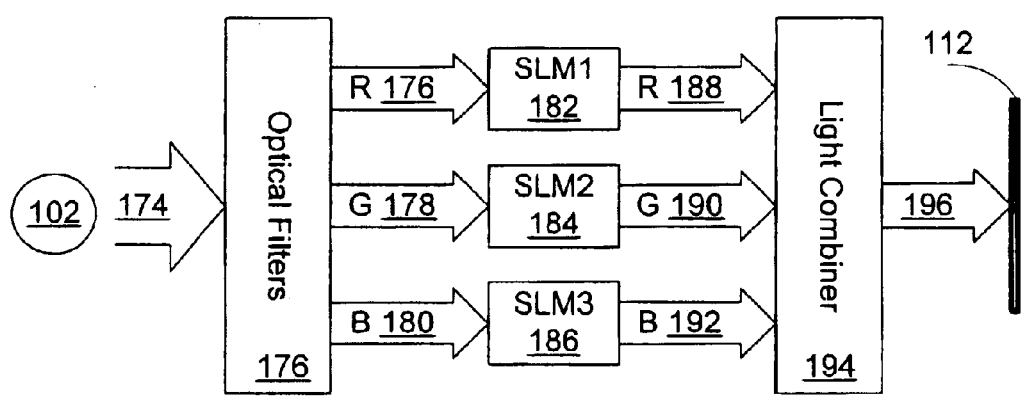
FIG. 4b is a block diagram schematically illustrating another display system that employs three spatial light modulators for respectively modulating three primary color (i.e. red, green and blue) light beams.

Referring to FIG. 4b, a block diagram illustrating a display system employing three spatial light modulators is presented thereon, wherein each spatial light modulator is designated for respectively modulating the three primary color (i.e. red, green and blue) light beams. As shown, light 174 from light source 102 passes through optical filters 176 and is split into three primary color light beams, that is, red light 176, green light 178 and blue light 180. Each color light beam impinges a separate spatial light modulator and is modulated thereby. Specifically, red light 176, green light 178 and blue light 180 respectively impinges spatial light modulators 182, 184 and 186 and are modulated. The modulated red light 188, green light 190 and blue light 192 are recombined at light combiner 194 for forming modulated color images. Combined color light 196 is directed (e.g. by projection lens) onto display target 112 for viewing. A simplified display system based on the block diagram of FIG. 4b is presented in FIG. 4c.

Figure 4C:
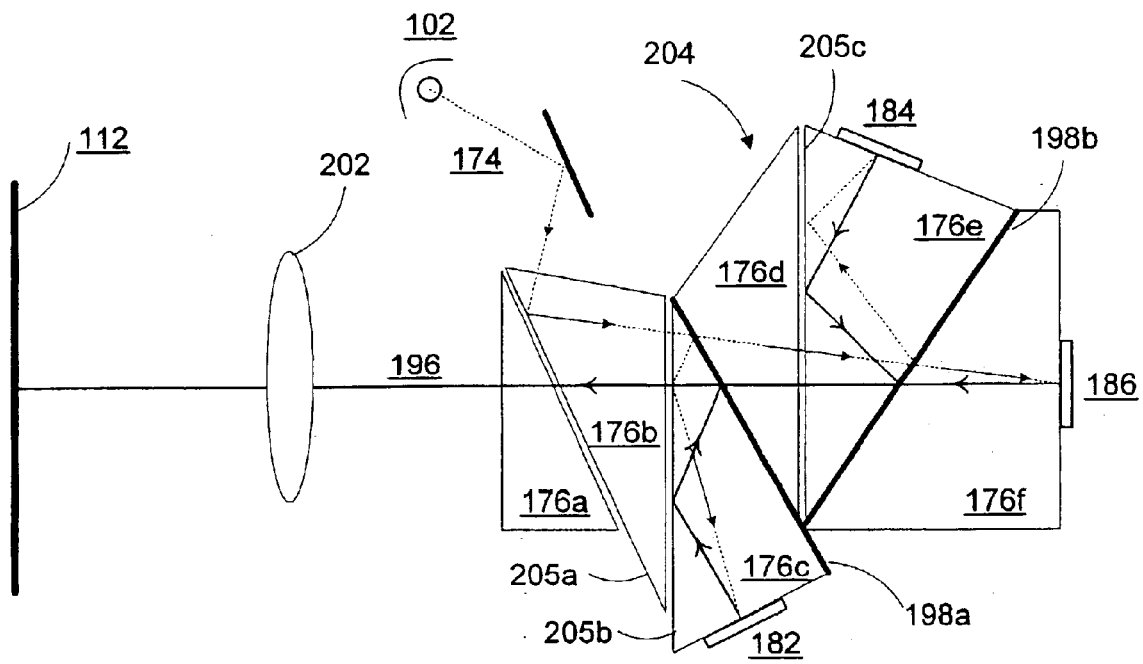
FIG. 4c is an exemplary diagram illustrating the display system of FIG. 4b.

Referring to FIG. 4c, the display system employs a dichroic prism assembly 204 for splitting incident light into three primary color light beams. Dichroic prism assembly comprises prisms 176a, 176b, 176c, 176d, 176e and 176f. Total-internal-reflection (TIR) surfaces, i.e. TIR surfaces 205a, 205b and 205c, are defined at the prism surfaces that face air gaps. The surfaces 198a and 198b of prisms 176c and 176e are coated with dichroic films, yielding dichroic surfaces. In particular, dichroic surface 198a reflects green light and transmits other lights. Dichroic surface 198b reflects red light and transmits other lights.

In operation, incident white light 174 from light source 102 enters into prism, 176b and is directed towards TIR surface 205a at an angle larger than the critical TIR angle of TIR surface 205a. TIR surface 205a totally internally reflects the incident white light towards spatial light modulator 186, which is designated for modulating the blue light component of the incident white light. At the dichroic surface 198a, the green light component of the totally internally reflected light from TIR surface 205a is separated therefrom and reflected towards spatial light modulator 182, which is designated for modulating green light. As seen, the separated green light may experience TIR by TIR surface 205b in order to illuminate spatial light modulator 182 at a desired angle. This can be accomplished by arranging the incident angle of the separated red light onto TIR surface 205b larger than the critical TIR angle of TIR surface 205b. The rest light components, other than the green light, of the reflected light from the TIR surface 205a pass through dichroic surface 198a and are reflected at dichroic surface 198b. Because dichroic surface 198b is designated for reflecting red light component, the red light component of the incident light onto dichroic surface 198b is thus separated and reflected onto spatial light modulator 184, which is designated for modulating red light. Finally, the blue component of the white incident light (white light 174) reaches spatial light modulator 186 and is modulated thereby. By collaborating operations of the three spatial light modulators, red, green and blue lights can be properly modulated. The modulated red, green and blue lights are recollected and delivered onto display target 112 through optic elements, such as projection lens 202, if necessary.

Figure 5:
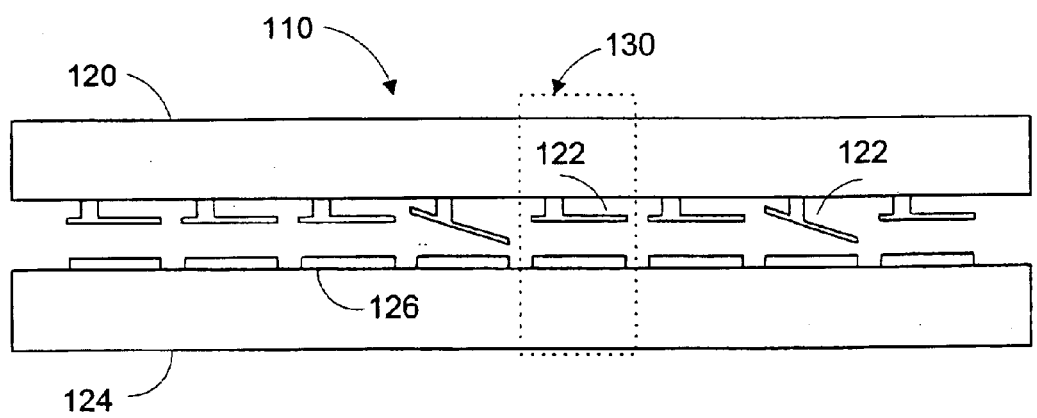
FIG. 5 is a cross-sectional view of a portion of the spatial light modulator used in the display system of FIG. 4 and a portion of an array of micro-mirrors comprised in the spatial light modulator.

In general, the spatial light modulator (e.g. 182, 184 or 186 in FIG. 4c) comprises an array of thousands or millions of micro-mirrors, a portion of a cross-sectional view of which is illustrated in FIG. 5. Referring to FIG. 5, an array of micromirrors (e.g. micromirrors 122) is formed a substrate 120, such as glass that is transparent to visible light.

Substrate 124, which comprises an array of electrodes (e.g. electrode 126) and circuitry (not shown), is placed proximate to the array of micromirrors for electrostatically controlling the motion of the micromirrors. In operation, each individual micromirror can be deformed as desired under the control of one or more electrodes and circuitry; thereby the spatial modulation of the incident light traveling through substrate 120 and shining on the surfaces of the micromirrors can be achieved.

The micromirror devices, such as micromirror device 130 can be fabricated in many ways, such as those set forth in U.S. Pat. Nos. 5,835,256 and 6,046,840 both to Huibers, and U.S. patent application Ser. No. 10/366,297 filed on Feb. 12, 2003 to Patel. An exemplary fabrication method according to an embodiment of the present invention will be discussed in the following with references to FIG. 6a through FIG. 7.

Figure 6A:
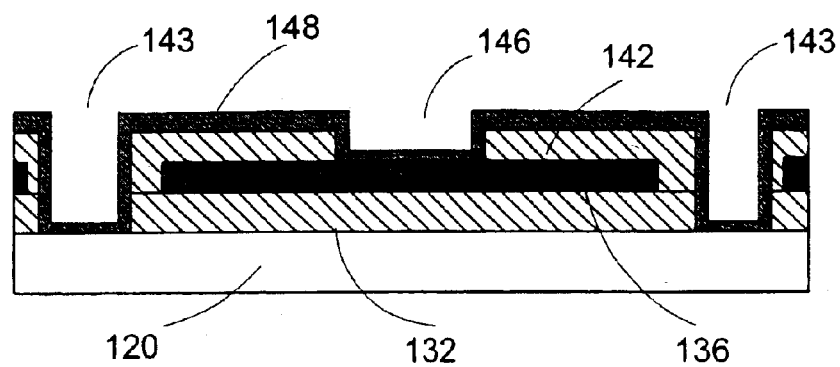
FIG. 6a is a cross-sectional views of a micromirror device of FIG. 5 before patterning the hinge layers during an exemplary fabrication process.
Figure 7:
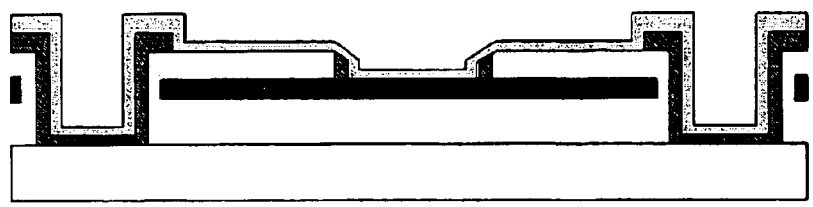
FIG. 7 is the cross-sectional view of FIG. 6b after removing the sacrificial and barrier layers.

Referring to FIG. 6a, substrate 120 is provided. Sacrificial layer 132 is deposited on the substrate followed by forming micromirror plate layer 136. The substrate can be a glass (e.g. 1737F, Eagle 2000), quartz, Pyrex™, sapphire etc. The substrate may also be a semiconductor substrate (e.g. silicon substrate) with one or more actuation electrodes and/or control circuitry (e.g. CMOS type DRAM) formed thereon.

Sacrificial layer 132 comprises an early transition metal, such as those elements in the periodic table in columns 3 to 7, namely columns beginning with Sc, Ti, V, Cr and Mn. Preferably, the sacrificial layer comprises an early transition metal selected from columns 4 through 6 of the periodic table (i.e. Ti, Zr, Hf, V, Nb, Ta, Cr, Mo and W). In particular, the sacrificial layer may comprise early transition metal element, early transition metal alloy, or early transition metal silicide. Exemplary early transition metal elements are titanium, tantalum, molybdenum and tungsten. Of course, other suitable early transition metal elements, such as zirconium, hafnium, vanadium, niobium and chromium are also applicable. The early transition metal alloy can be any suitable alloys of two or more early transition metal elements, such as tungsten titanium, tungsten molybdenum and tungsten tantalum. The early transition metal silicides can be any suitable silicides of one or more early transition metal elements or alloys, such as tungsten silicide, titanium silicide, molybdenum silicide, tungsten titanium silicide, zirconium silicide, chromium silicide or other suitable silicides.

The thickness of sacrificial layer 132 can be wide ranging depending upon the micromirror size and desired titled angle of the micromirror plate, though a thickness of from 500 Å to 50,000 Å, preferably around 10,000 Å, is preferred. The sacrificial layer may be deposited on the substrate using any suitable method, such as PVD (e.g. sputtering and evaporation), CVD (e.g. Plasma Enhanced CVD, Low Pressure CVD, Alcohol Catalytic CVD and MetalOrganic CVD).

After depositing the sacrificial layer, micromirror plate layer 136 for a micromirror device is deposited. Because the micromirror plate is designated for reflecting incident light in the spectrum of interest (e.g. visible light spectrum), it is preferred that the micro-mirror plate layer comprises of one or more materials that exhibit high reflectivity (preferably 90% or higher) to the incident light. Examples of such materials are Al, Ti, Ag, $AlSi_xCu_y$, $AlTi_x$, or $AlSi_x$. Of course, other suitable materials having high reflectivity to the incident light of interest may also be adopted for the micromirror plate. In depositing the micromirror plate layer, PVD is preferably used. The thickness of the micro-mirror plate layer can be wide ranging depending upon many factors, such as desired mechanical (e.g. stiffness and strength) and electronic (e.g. conductivity) properties, the size, desired rotation angle of the micro-mirror plate and the properties of the materials selected for the micromirror plate. According to the invention, a thickness of from 500 Å to 50,000 Å, preferably around 2500 Å, is preferred. If the micromirror plate layer comprises aluminum, it is preferred to be deposited at 150° C. to 300° C. or other temperatures preferably less than 400° C. Alternatively, the micromirror plate can be a multilayered structure. For example, the multilayered micromirror plate may comprise a light reflecting layer (an Al layer with a preferred thickness of 2500 Å) and an enhancing layer (a Ti layer with a preferred thickness of 80 Å). In fabricating this multilayered micromirror plate, other layers may also be deposited for protecting the micromirror plate. Specifically, a $SIO_x$ protecting layer may be deposited before depositing the light reflecting layer, and another $SIO_x$ protecting layer may be deposited after depositing the enhancing layer for protecting the enhancing layer.

Figure 8A:
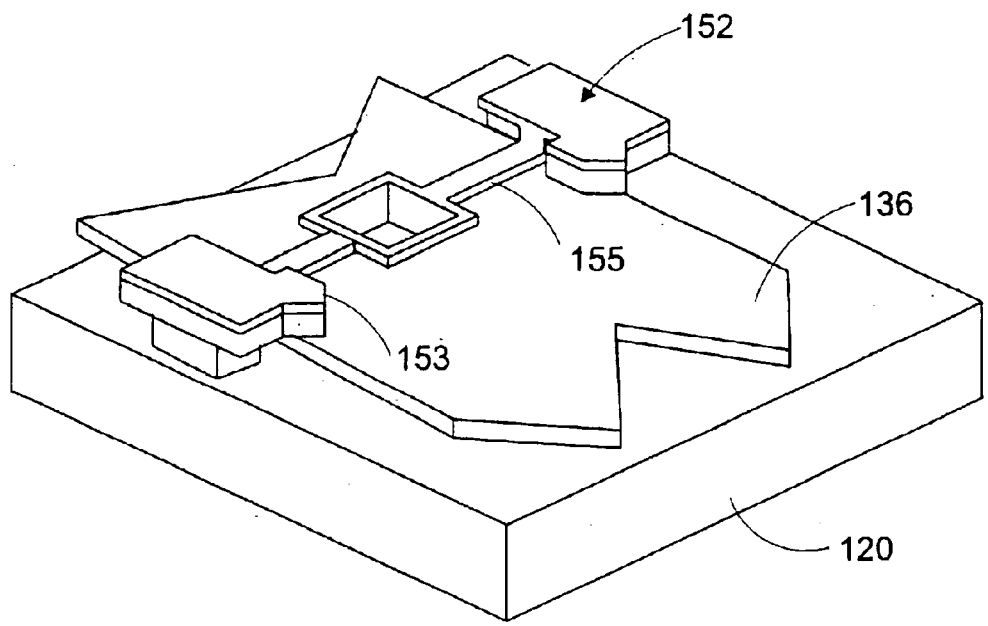
FIG. 8a shows an exemplary micromirror device after releasing.

Micromirror plate layer 136 is then patterned into a desired shape, an example of which is illustrated in FIG. 8a. Though preferred, it would be appreciated by those ordinary skilled in the arts that this particular example of micromirror shape is a selection from a variety of optional choices of mirror shapes and is for demonstration purposes only. It should not be interpreted as a limitation. Instead, the micromirror plate can be of any desired shape. The patterning of the micromirror plate can be achieved using the standard photoresist patterning followed by etching using, for example $CF_4$, $Cl_2$, or other suitable etchant depending upon the specific material of the micromirror plate.

After forming the micro-mirror plate, sacrificial layer 142 is deposited for forming other structures, such as hinge 152 in FIG. 8a, of the micromirror device. Similar to sacrificial layer 132, sacrificial layer 142 will be removed along with sacrificial layer 132 afterwards. Exemplary sacrificial materials for sacrificial layer 142 can be the same as those for the sacrificial layer 134. Though preferably the same, the material for sacrificial layer 142 may not be the same as that for the sacrificial layer.

After the deposition, the deposited sacrificial layers, including sacrificial layers 132 and 142, are patterned for forming two deep-via areas 143 and shallow via area 146 using standard lithography technique followed by etching. The etching process will be detailed afterwards with reference to FIG. 10 through FIG. 13. The distance across the two deep-via areas 331 depends upon the side-to-side distance of the micro-mirror plate. In an embodiment of the invention, the distance across the two deep-via areas after the patterning is preferably around 10 μm, but can be any suitable distance as desired. The shallow-via area, which can be of any suitable size, is preferably on the order of 2 μm.

In order to form the desired deep-via area 143 profiles as shown, a via-mask and partial sacrificial layer etching are applied. According to an embodiment of the invention, the wider region of each deep-via area 143 is on the order of 1.0 to 2.0 μm, preferably 1.4 μm, and the smaller region is on the order of 0.5 to 1.5 μm, preferably 1.0 μm. Of course, other dimensions are possible depending upon the final size and shape of the micro-mirror plate. As a feature of the embodiment, the deep-via areas may reach through sacrificial layer 132 and may reach from 500 Å to 2000 Å into substrate 120. As discussed above, the deep-via areas are formed in two etching steps. By doing so, the effect of resist erosion may be reduced, and step coverage of $SiN_x$ in the subsequent deep-via fill deposition may be improved. However, a single etching step can also be used.

After patterning the sacrificial layers, one or more hinge structure layers (e.g. 148) are deposited for forming a hinge structure. During the deposition, layer 148 fills the formed deep-via areas and shallow-via area. Because the hinge structure layer is designated to form the posts (e.g. 153 in FIG. 8a) for holding the hinge (e.g. 253 in FIG. 8a) and the micromirror plate (e.g. 136 in FIG. 8a) attached thereto such that the micromirror plate can rotate relative to the substrate by the hinge, it is desired that the hinge structure layer comprise materials having a sufficiently large elastic modulus. According to the embodiment of the invention, the hinge structure layer can be formed of a transition metal nitride which is resistant to attack by the spontaneous gas phase chemical etchant used in the final release. The transition metal nitride layer is preferably formed by sputtering a transition metal target (e.g. a single transition metal, more than one transition metal such as an alloy of two or more transition metals, or a transition metal compound (e.g. transition metal aluminide or preferably suicide) in nitrogen and Ar gases. Though the target could be a combination of more than one transition metal (or two transition metals in alloy form), in one embodiment it is preferred that the target comprise a single transition metal, or one (or more) transition metals and one or more metalloids (and, perhaps, minute quantities of impurities such as O, H, other transition metals, metalloids, etc., which are often present in various sputtering methods). In the embodiment, the target comprises at least one transition metal and at least one metalloid. In another embodiment, the target comprises a single transition metal without any other metals except perhaps as impurities or in trace amounts. In such a case, it is preferred that the transition metal of the target make up 90% or more of the target, preferably 98% or more. And, though nitrogen and Ar are the preferred gases for sputtering, small amounts of oxygen or hydrogen in the sputtering gas can result in small amounts of oxygen or hydrogen (or compounds thereof such as a transition metal oxide in small amounts) in the layer or structure being formed by the sputtering in the method of the present invention. In particular, the hinge structure layer may comprise a $TiN_x$, and a $SiN_x$, layers deposited using PVD and PECVD, respectively.

The PVD (physical vapor deposition) can be performed in any of a number of known PVD systems, including dc glow-discharge sputtering systems, rf glow discharge sputtering systems, and magnetron sputtering systems. Commercially available examples include the Varia (3000 series) sputtering system, the Applied Materials Endura VHP PVD system, the Applied Materials Centura HP PVD system, and the MRC Eclipse Sputtering system. Other systems and methods are disclosed in the Handbook of Physical Vapor Deposition, D. M. Mattox, 1998, incorporated herein by reference. The sputtering target can be any suitable target, such as one supplied by Cerac, Honeywell or Praxair.

The transition metals are those elements in the periodic table in columns 3 to 12 (1B to 8B), namely columns beginning with Sc, Ti, V, Cr, Mn, Fe, Co, Ni, Cu and Zn. Preferred are those elements in columns 3B, 4B, 5B, 6B and 7B—however late transition metals in columns 8B, 1B and 2B are also possible in the present invention for the hinge structure layers of the micromirror device, though preferably in conjunction with an early transition metal. In the embodiment of the invention, a single transition metal is sputtered from a target in a nitrogen atmosphere to form a (single) transition metal nitride. It is also within the invention to provide a target with more than one transition metal (or a plurality of targets with different transition metals). In the embodiment of the invention, the target comprises at least one late transition metal—and single or multiple early transition metals that each form nitrides when sputtered. The late transition metal target can also comprise one or more early transition metals and/or one or more metalloids (B, Si, Ge, As, Sb)—each forming nitrides during sputtering. It is also possible to use only metalloids (a single metalloid or more than one metalloid in the target); though having at least one transition metal is preferred in the present invention. For many late transition metal nitrides, the films will be predominantly ternary—at least in part (amorphous and/or nanophase), whereas binary nitride films (e.g. many nitrides of early transition metals) will often be polycrystalline, at least in part. Processing parameters can be optimized to increase amorphousness of the deposited film.

If a plurality of metals or metalloids is present in the hinge structure layer, each need not be formed as a compound with nitrogen. It is within the invention that one transition metal or metalloid is in nitride form, and an additional metal or metalloid is present in element form. For example, a single transition metal nitride can be present in the structure layer along with an additional metal or metalloid in elemental form. Likewise, a metalloid nitride can be present in the structure layer along with an additional metal or metalloid in compound or elemental form. In a specific embodiment, the structure layer comprises a transition metal nitride and a metalloid nitride (e.g. silicon nitride) and the etchant is a noble gas fluoride. In another embodiment, the structure layer comprises a transition metal nitride or a transition metal oxynitride with optional minor amounts of boron, carbon or phosphorous. Preferred early transition metal nitrides (including early transition metal silicon nitrides, oxynitrides, silicon oxynitrides, carbonitrides etc.) are those from columns 3b (Sc, Y, Lu, Lr), 4b (Ti, Zr, Hf, Rf), 5b(V, Nb, Ta, Db), 6b (Cr, Mo, W, Sg) and 7b (Mn, Tc, Re, Bh) of the periodic table. However, preferred are early transition metals in columns 4b to 6b, in particular tungsten, molybdenum, titanium, zirconium, hafnium, niobium, tantalum, vanadium and chromium.

Si and B are preferred metalloids, though any of the metalloids can be used in the present invention. Ti, V, Zr, Ta, Mo and W are preferred early transition metals, though any of the early transition metals can be used in the present invention in accordance with the above. Some specific examples within the present invention include tantalum nitride, tantalum silicon nitride, tantalum oxynitride, tantalum silicon oxynitride, vanadium nitride, vanadium oxynitride, titanium nitride, titanium silicon nitride, titanium silicon oxynitride, titanium boronitride, zirconium nitride, tungsten silicon nitride, tungsten nitride, tungsten silicon oxynitride, tungsten oxynitride, tungsten silicon carbonitride, molybdenum silicon nitride, molybdenum silicon oxynitride, tungsten boronitride, indium nitride, hafnium nitride, and Preferred are binary (nitrides) or ternary nitrides of titanium, tantalum and tungsten (e.g. silicon nitrides, silicon oxynitrides, oxynitrides). These are but a few examples that can be used for the MEMS structure (particularly the hinge structure layer of the MEMS device) as set forth herein.

Si can be added to the target so that the film formed resembles a late transition metal+SiNx (in one embodiment of the invention, two early transition metals and silicon are part of a target, whereas in another embodiment of the invention, one or more late transition metals and silicon are present in the target). Some of these types of films are disclosed in U.S. provision application 60/228,007 to Reid et al. filed Aug. 23, 2000, incorporated herein by reference. Also, near metalloids such as phosphorous and/or carbon can be added to the transition metal target so as to form transition metal—phosphonitrides and/or transition metal— carbonitrides. Oxygen is preferably not present in the sputtering atmosphere if electrically conductive films are desired—however, some transition metals form electrically conductive compounds with oxygen, e.g. Ru and In (which form $RuO_2$ and $In_2O_3$).

According to the embodiment of the invention, layer 148 comprises a 300 Å thickness of $TiN_x$ layer deposited by PVD, and a 3500 Å thickness of $SiN_x$ layer deposited by PECVD. Of course, other suitable methods of deposition may be used, such as LPCVD or sputtering. Of course, other suitable materials, such as $CoSiN_x$, $TiSiN_x$, $TaSi_xN_y$, $TiO_x$.

After the deposition, the hinge structure layer is patterned for forming two posts 150 and contact (not shown) by etching using one or more proper etchants. In particular, the layers can be etched with a chlorine chemistry or a fluorine chemistry where the etchant is a perfluorocarbon or hydrofluorocarbon (or $SF_6$) that is energized so as to selectively etch the hinge layers both chemically and physically (e.g. a plasma/RIE etch with $CF_4$, $CHF_3$, $C_3F_8$, $CH_2F_2$, $C_2F_6$, $SF_6$, etc. or more likely combinations of the above or with additional gases, such as $CF_4/H_2$, $SF_6/Cl_2$, or gases using more than one etching species such as $CF_2Cl_2$, all possibly with one or more optional inert diluents). Different etchants may, of course, be employed for etching each hinge layer (e.g. chlorine chemistry for a metal layer, hydrocarbon or fluorocarbon (or $SF_6$) plasma for silicon or silicon compound layers, etc.).

Figure 6B:
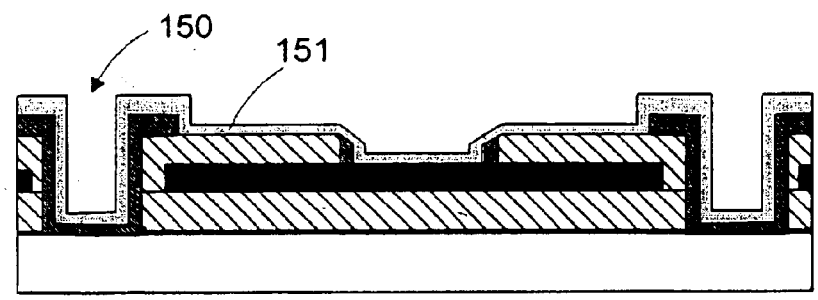
FIG. 6b is a cross-sectional view of FIG. 6a before patterning hinge structure layers.

After the patterning of the hinge structure layer, hinge layer 151 is deposited and then patterned as shown in FIG. 6b. Because the hinge deforms with the micromirror plate rotating, it is expected that the hinge is more compliant. Furthermore, when the hinge is also used as electric conducting media for the micro-mirror plate, it is further expected that the hinge is electrically conductive. Examples of suitable materials for the hinge layer are silicon nitride, silicon carbide, polysilicon, Al, Ir, titanium, titanium nitride, titanium oxide(s), titanium carbide, $CoSi_xN_y$, $TiSi_xN_y$, $TaSi_xN_y$, or other ternary and higher compounds. When titanium is selected for the hinge layer, it can be deposited at 100° C. to 400° C. Other ternary compositions, such as set forth in U.S. patent applications Ser. No. 09/910,537 filed on Jul. 20, 2001, Ser. No. 10/198,389 filed Jul. 16, 2002, and Ser. No. 10/174,478 filed on Jun. 21, 2002, both to Reid, each incorporated herein by reference, are also applicable. Alternatively, the hinge can be a multilayered structure, such as those disclosed in U.S. patent application Ser. No. 10/366,297 filed on Feb. 12, 2003 to Patel, the subject matter of which being incorporated herein by reference.

After deposition, the hinge layer is patterned and etched. Similar to the hinge structure layer (layer 148), the hinge layer can be etched with a chlorine chemistry or a fluorine chemistry where the etchant is a perfluorocarbon or hydrofluorocarbon (or $SF_6$) that is energized so as to selectively etch the hinge layers both chemically and physically (e.g. a plasma/RIE etch with $CF_4$, $CHF_3$, $C_3F_8$, $CH_2F_2$, $C_2F_6$, $SF_6$, etc. or more likely combinations of the above or with additional gases, such as $CF_4/H_2$, $SF_6/Cl_2$, or gases using more than one etching species such as $CF_2Cl_2$, all possibly with one or more optional inert diluents). Different etchants may, of course, be employed for etching the hinge layer (e.g. chlorine chemistry for a metal layer, hydrocarbon or fluorocarbon (or $SF_6$) plasma for silicon or silicon compound layers, etc.).

Finally, the sacrificial layers (132 and 142) are removed by etching so as to release micromirror device 130, which will be discussed afterwards.

The above exemplary fabrication process is illustrated with reference to two sacrificial layers both being removable after releasing. According to another embodiment of the invention, a non-removable barrier layer (e.g. barrier layer 144 in FIG. 3) is deposited and patterned after the micromirror plate. In this case, the barrier layer is patterned according to the micromirror plate after its deposition and before forming other structure layers (e.g. hinge layer 148). As a result, the patterned barrier layer remains after releasing the micromirror device. This remained patterned barrier layer can be used for protecting the micromirror plate in operation. Because the barrier layer is not removable after releasing, it comprises different barrier material(s) from the sacrificial layer. Exemplary barrier materials for the barrier layer are inter-metallic metal compounds, early transition metal nitrides (e.g. $WN_x$, $TiN_x$, $TaN_x$ and $AlTi_xN_y$), early transition metal oxides, early transition metal nitride oxides and early transition metal carbides.

As an alternative feature of the embodiment of the invention, a separate sacrificial layer (e.g. amorphous silicon) other than sacrificial layer 132 in FIG. 1 may be deposited before depositing sacrificial layer 132. The separate sacrificial layer is preferably removable along with sacrificial layer 132 during or after the releasing process. Though it is preferred that the separate sacrificial layer is removed with sacrificial layer 132 using one etching process, the separate sacrificial layer may be removed by a separate etching process. Moreover, another sacrificial layer comprising one or more early transition metals can be deposited on the formed structure layer (e.g. structure layer 136 in FIG. 1). In particular, this sacrificial layer comprises tungsten silicide.

Figure 8B:
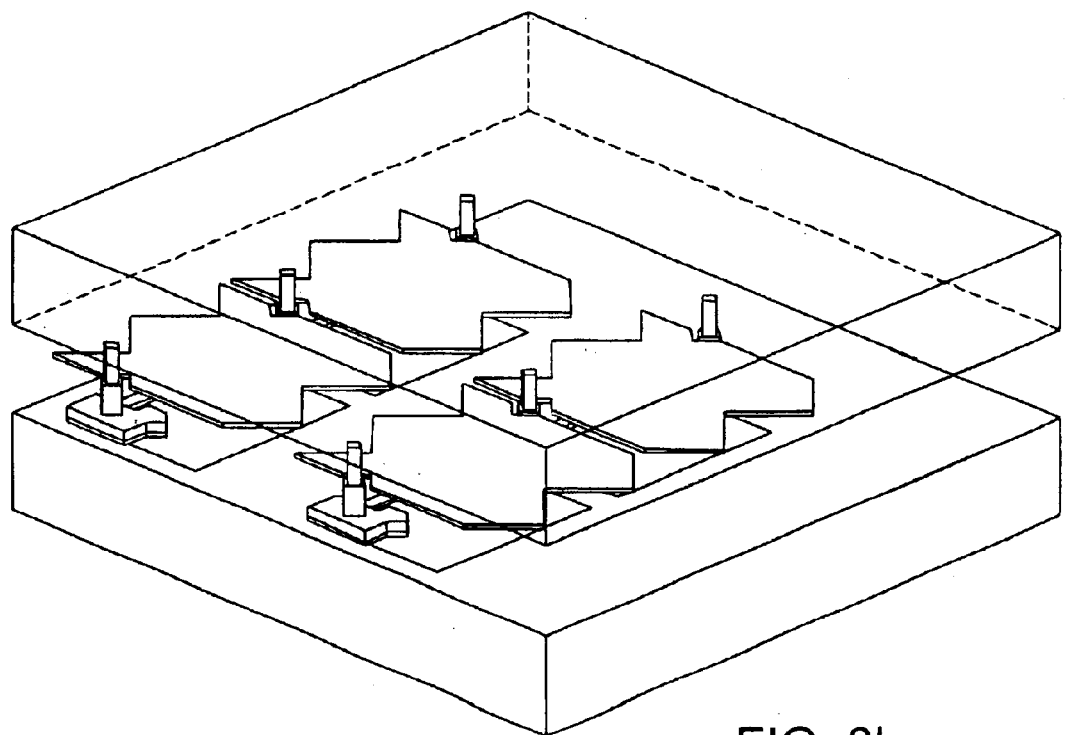
Figure 9A:
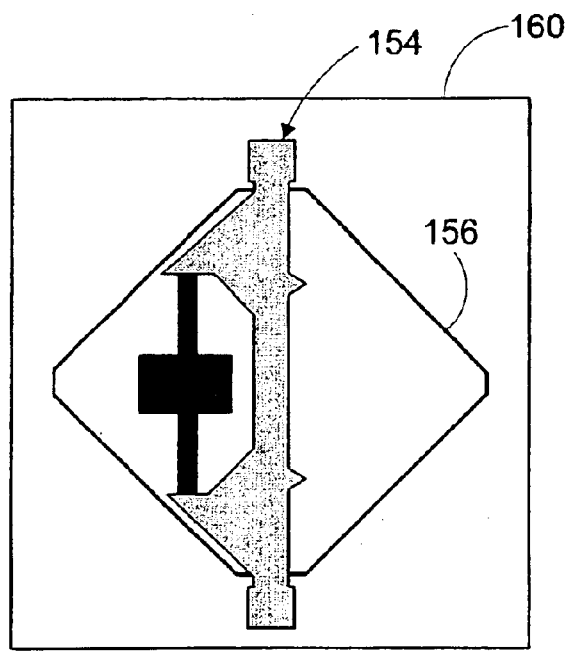
FIG. 9a is a back-view of another exemplary micromirror device after releasing.
Figure 9B:
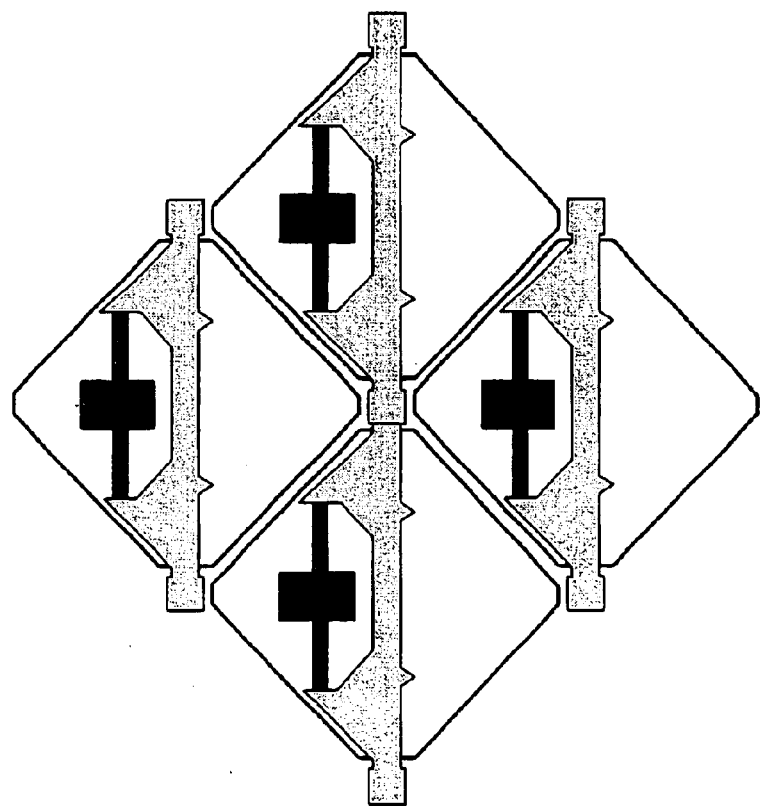

The method of the present invention can be applied in fabricating a variety of micromirror devices, one of which is shown in FIG. 8a. Other micromirror devices, such as the micromirror device in FIG. 9a, can also be fabricated using the method disclosed in the presented invention. As seen in FIG. 9a, micromirror device 160 comprises hinge 154 and micromirror plate 156, and other features such as those described in U.S. patent application Ser. No. 10/366,297 filed on Feb. 12, 2003 to Patel, the subject matter of which being incorporated herein by reference. The released micromirror devices, such as those in FIG. 8a and FIG. 9a can be used in micromirror arrays, as shown in FIG. 8b and FIG. 9b, respectively. The micromirror arrays may be employed by spatial light modulators, such as that in FIG. 5, which is used in display systems, such as those in FIGS. 4a, FIG. 4b and FIG. 4c.

Release Process

The release etch utilizes an etchant gas capable of spontaneous chemical etching of the sacrificial material, preferably isotropic etching that chemically (and not physically) removes the sacrificial material. Such chemical etching and apparatus for performing such chemical etching are disclosed in U.S. patent application Ser. No. 09/427,841 to Patel et al. filed Oct. 26, 1999, and in U.S. patent application Ser. No. 09/649,569 to Patel at al. filed Aug. 28, 2000, the subject matter of each being incorporated herein by reference. Preferred etchants for the release etch are spontaneous chemical vapor phase fluoride etchants that, except for the optional application of temperature, are not energized. Examples include HF gas, noble gas halides such as xenon difluoride, and interhalogens such as $IF_5$, $BrCl_3$, $BrF_3$, $IF_7$ and $ClF_3$. The release etch may comprise additional gas components such as $N_2$ or an inert gas (Ar, Xe, He, etc.). In this way, the remaining sacrificial material and/or removable barrier layers are removed and the micromirror device is released. In one aspect of such an embodiment, $XeF_2$ is provided in an etching chamber with diluent (e.g. $N_2$ and He). The concentration of $XeF_2$ is preferably 8 Torr, although the concentration can be varied from 1 Torr to 30 Torr or higher. This non-plasma etch is employed for preferably 900 seconds, although the time can vary from 60 to 5000 seconds, depending on temperature, etchant concentration, pressure, quantity of sacrificial material to be removed, or other factors. The etch rate may be held constant at 18 Å/s/Torr, although the etch rate may vary from 1 Å/s/Torr to 100 Å/s/Torr. Each step of the release process can be performed at room temperature.

Figure 10:
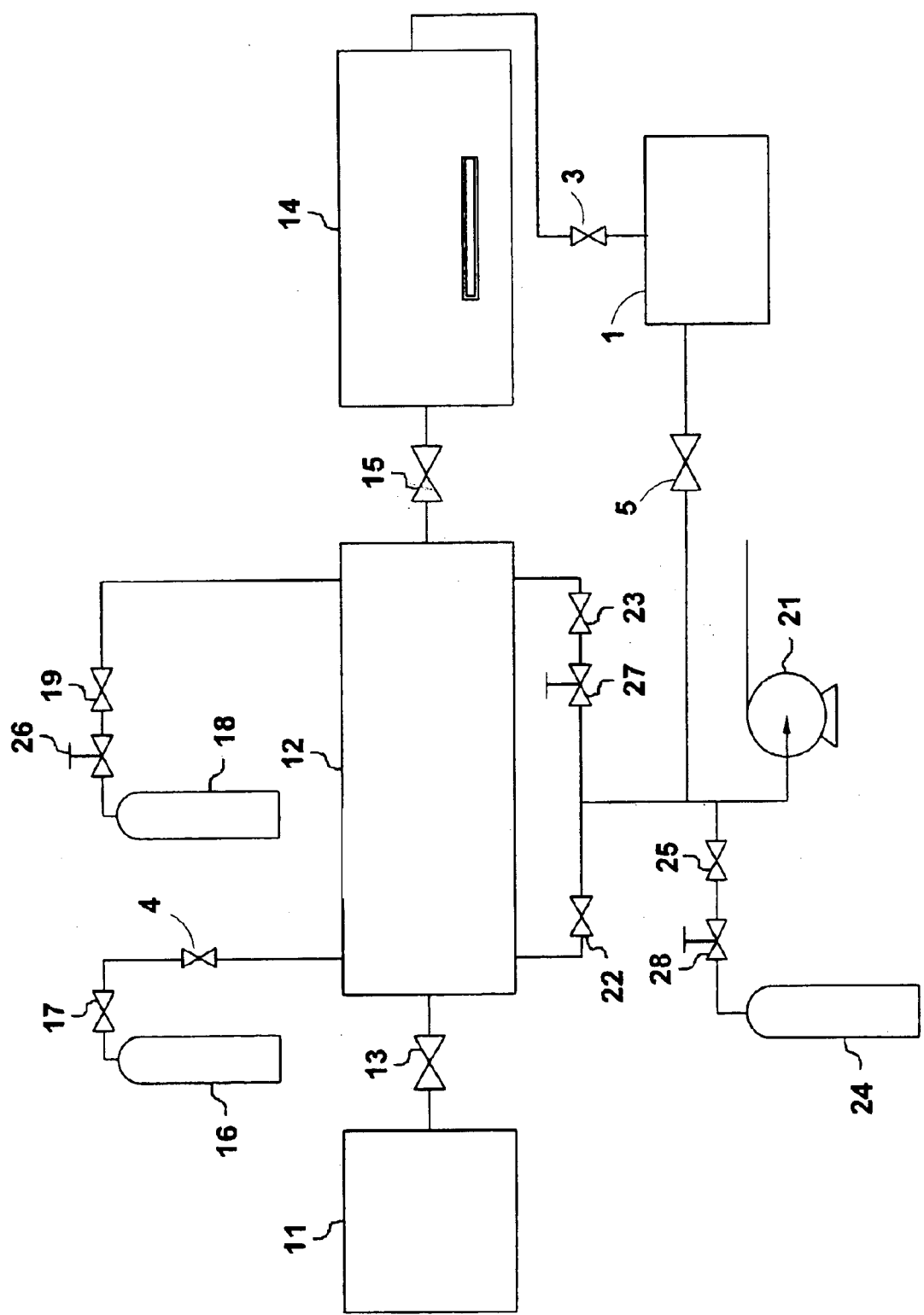
FIG. 10 is a diagram showing an exemplary etching system used in the embodiments of the invention.

In the following, exemplary etching methods and appropriate etchants are discussed with reference to FIG. 10 through FIG. 13. As can be seen in FIG. 10, an apparatus is provided for etching a sample that includes a source chamber 11 containing a source of chemical etchant, maintained at a particular temperature and pressure for maintaining the etchant source in a solid or liquid state (e.g. solid state for XeF2 crystals, liquid state for BrF3, etc.). An expansion chamber 12 is in fluid communication with source chamber 11 and has any suitable size (e.g. a volumetric capacity of 29 cubic inches (0.46 liter)) to receive etchant gas from the source chamber 11, with a shutoff valve 13 joining these two chambers. An etch chamber 14 is provided in fluid communication with expansion chamber 12 and has any suitable size (e.g. volumetric capacity of 12 cubic inches (0.18 liter)) to contain the sample microstructure to be etched. It is preferred that the etch chamber be smaller than the expansion chamber. The etch chamber 14 is connected to the expansion chamber 12 via a shutoff valve 15. Also included in the apparatus is a first gas source 16 in fluid communication with the expansion chamber 12 via a further shutoff valve 17, a second gas source 18 in fluid communication with the expansion chamber through a separate shutoff valve 19, a vacuum pump 21 and associated shutoff valves 22, 23 to control the evacuation of the chambers.

Also shown in FIG. 10 are a third gas source 24 serving as a pump ballast with an associated shutoff valve 25 to prevent backstreaming from the pump 21, and needle valves 26, 27, 28 to set the gas flow rates through the various lines and to permit fine adjustments to the pressures in the chambers. Also shown, as will be discussed in more depth below, are gas analyzer 1 and valves 3 and 5 on opposite sides of the analyzer. The expansion chamber 12 and the etch chamber 14 can both be maintained at a particular temperature, while different gases are placed in the first and second gas sources for the various etching processes. It should be noted that a single gas source could be used in place of gas sources 16 and 18.

The general procedure followed in these experiments began with the evacuation of both the expansion chamber 12 and the etch chamber 14, followed by venting both chambers to atmospheric pressure with gas from the first gas source 16 by opening the two shutoff valves 17, 15, between this gas source and the two chambers. The sample was then placed in the etch chamber 14 (with the shutoff valves 7, 15 open during the sample insertion) which was then sealed, and both the expansion chamber 12 and the etch chamber 14 were evacuated. All valves were then closed.

The connecting valve 15 between the expansion chamber 12 and the etch chamber 14 was opened, and the shutoff valve 17 at the outlet of the first gas source 16 was opened briefly to allow the gas from the first gas source to enter the expansion and etch chambers. The shutoff valve 17 is then closed. The connecting valve 15 is then closed, and the expansion chamber 12 is evacuated and isolated. The supply valve 13 from the etchant source chamber 11 is then opened to allow etchant gas to enter the expansion chamber (due to the higher temperature of the expansion chamber). The supply valve 13 is then closed, outlet valve 23 is opened, and the needle valve 27 is opened slightly to lower the etchant pressure in the expansion. Both the outlet valve 23 and the needle valve 27 are then closed. The shutoff valve 19 at the second gas source 18 is then opened and with the assistance of the needle valve 26, gas from the second gas source is bled into the expansion. At this point the expansion chamber 12 contains the etchant gas plus gas from the second gas source 18, while the etch chamber 14 contains gas from the first gas source.

With pump 21 on, the connecting valve 15 between the expansion chamber 12 and the etch chamber 14 is then opened, and valves 3 and 5 are opened on both sides of gas analyzer 1, to allow the gas mixture from the expansion chamber to enter the etch chamber and flow through the etch chamber and gas analyzer, thereby beginning the etch process. The gas analyzer 1 could also be directly connected to the etching chamber. As will be discussed further below, the etch process is continued until an endpoint is detected via the gas analyzer.

Many alternatives to the process scheme described above can be used. Additional gas sources and chambers, for example, can be utilized. For example, depending upon the diluent(s) used (gas sources 16 and 18), a plurality of diluent sources (N2, Ar, He, etc.) can be connected to the expansion chamber and/or to the recirculation loop for bleeding the system after an etch. The air distribution system within the etching chamber can also be varied, for example by including U-shaped or cone-shaped baffles, or by using additional perforated plates and/or baffles.

Figure 11:
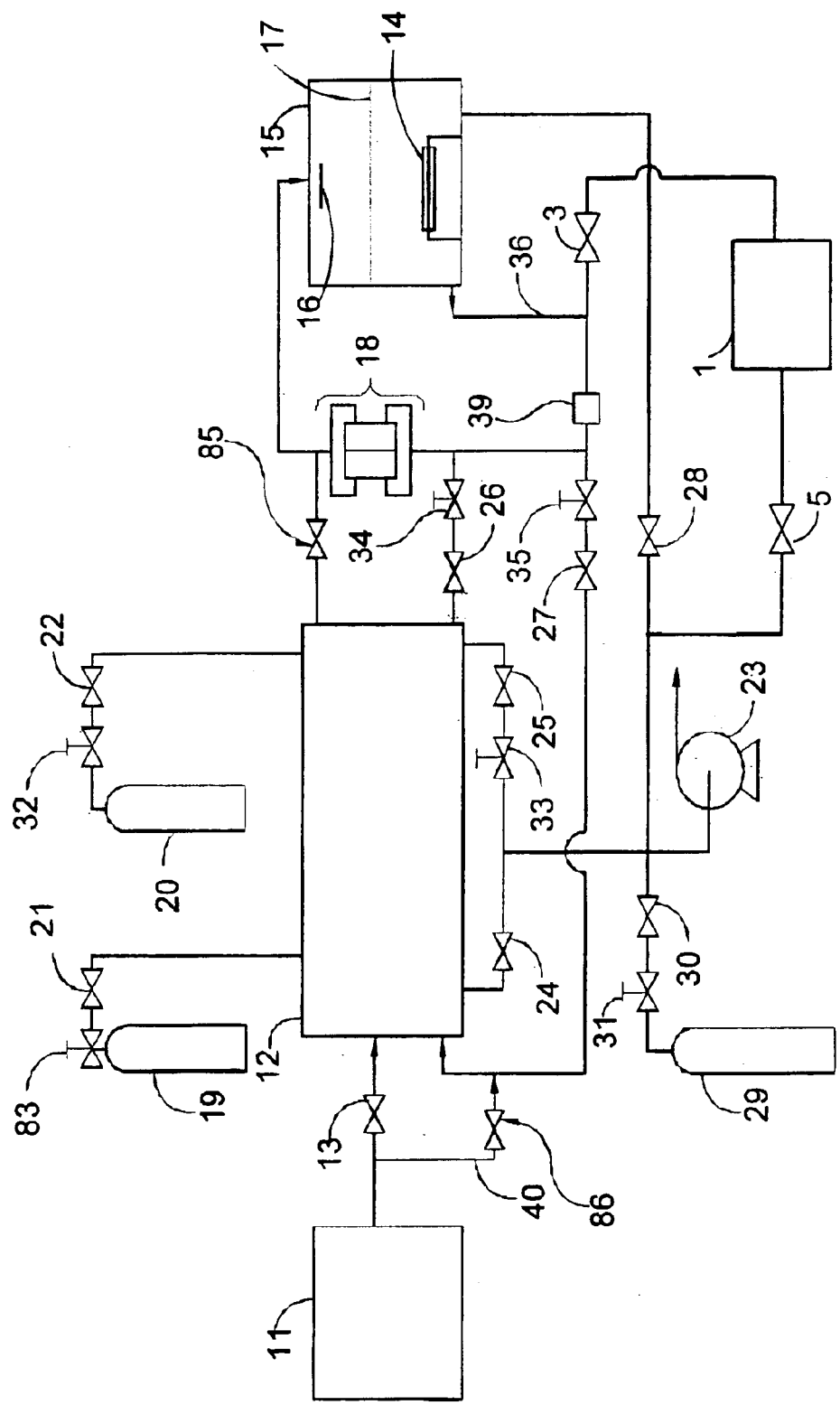
FIG. 11 is a diagram showing another exemplary etching system used in the embodiments of the invention.

A specific alternative to the embodiment of FIG. 10 is illustrated in FIG. 11. FIG. 11 represents such a process flow arrangement in which the process is an etching process having a detectable end point. The etchant gas originates in a source chamber 11. An example of an etchant gas that is conveniently evaporated from a liquid is bromine trifluoride, whereas an example of an etchant gas that is conveniently sublimated from solid crystals is xenon difluoride. Effective results can be achieved by maintaining the crystals under 40 degrees C. (e.g. at a temperature of 28.5° C.). (Xenon difluoride is only one of several etchant gases that can be used. Examples of other gases are presented below.) The sublimation pressure of xenon difluoride crystals at 28.5° C. is 5–11 mbar (4–8 torr). An expansion chamber 12 receives xenon difluoride gas from the crystals in the source chamber(s) 11, and a shutoff valve 13 is positioned between the source and expansion chambers. The sample 14 to be etched is placed in an etch chamber 15 (which contains a baffle 16 a perforated plate 17), and a reciprocating pump 18 that is positioned between the expansion chamber 12 and the etch chamber 15. (The reciprocating pump and its valves are shown in more detail in FIGS. 12a and 12b and described below.) Also illustrated in FIG. 12a, and will be discussed further below, is a gas analyzer 1 with valves 3 and 5 that control the flow of gas from the etching chamber through the gas analyzer.

Also shown are two individual gas sources 19, 20 supplying the expansion chamber 12 through shutoff valves 21, 22, a vacuum pump 23 and associated shutoff valves 24, 25, 26, 27, 28 to control the evacuation of the chambers, a third gas source 29 serving as a pump ballast with an associated shutoff valve 30 to prevent backstreaming from the pump 23, and manually operated needle valves 31, 32, 33, 34, 35, 83 to set the gas flow rates through the various lines and to permit fine adjustments to the pressures in the chambers. When xenon difluoride is used, the expansion chamber 12 and the etch chamber 15 are typically maintained at around room temperature (e.g. 25.0° C.). However, the expansion chamber and etch chamber could also be heated (e.g. to between 25 and 40 degrees C.), though this would likely be performed in conjunction with directly cooling the sample being processed, as will be discussed below. A recirculation line 36 permits gas to flow continuously through the etch chamber 15 in a circulation loop that communicates (via valves 26, 27, and 34, 35) with the expansion chamber 12 and reenters the etch chamber 15 by way of the reciprocating pump 18. Valve 85 permits gas transfer between expansion chamber 12 and etch chamber 15 via a portion of the recirculation line 36 without traversing recirculation pump 18. Valve 86 in path 40 permits introduction of etchant gas into the expansion chamber 12 to replenish the etchant mixture during the etching process. The valves are preferably corrosive gas resistant bellows-sealed valves, preferably of aluminum or stainless steel with corrosive resistant O-rings for all seals (e.g. Kalrez™ or Chemraz™). The needle valves are also preferably corrosion resistant, and preferably all stainless steel. A filter 39 could be placed in the recirculation line 36 to remove etch byproducts from the recirculation flow (though preferably not the product(s) being monitored for end point detection), thereby reducing the degree of dilution of the etchant gas in the flow. The filter can also serve to reduce the volume of effluents from the process.

The etch chamber 15 can be of any shape or dimensions, but the most favorable results will be achieved when the internal dimensions and shape of the chamber are those that will promote even and steady flow with no vortices or dead volumes in the chamber interior. A preferred configuration for the etch chamber is a circular or shallow cylindrical chamber, with a process gas inlet port at the center of the top of the chamber, plus a support in the center of the chamber near the bottom for the sample, and an exit port in the bottom wall or in a side wall below the sample support. The baffle 16 is placed directly below the entry port. The distance from the port to the upper surface of the baffle is not critical to this invention and may vary, although in preferred embodiments of the invention the distance is within the range of from about 0.1 cm to about 6.0 cm, and most preferably from about 0.5 cm to about 3.0 cm. Although its shape is not shown in FIG. 2, the baffle is preferably circular or otherwise shaped to deflect the gas stream radially over a 360° range. The perforated plate 17 is wider than the baffle 16 and preferably transmits all gas flow towards the sample. A preferred configuration for the perforated plate is one that matches the geometry of the sample; thus, for a circular sample the perforated plate is preferably circular as well.

Figure 12A:
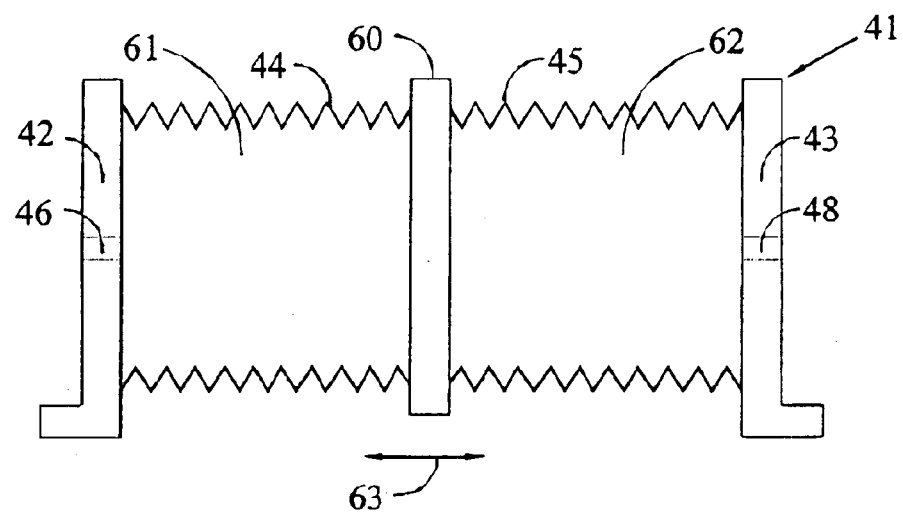
FIG. 12a is a side elevation view of an exemplary reciprocating pump for use in the exemplary etching system.
Figure 12B:
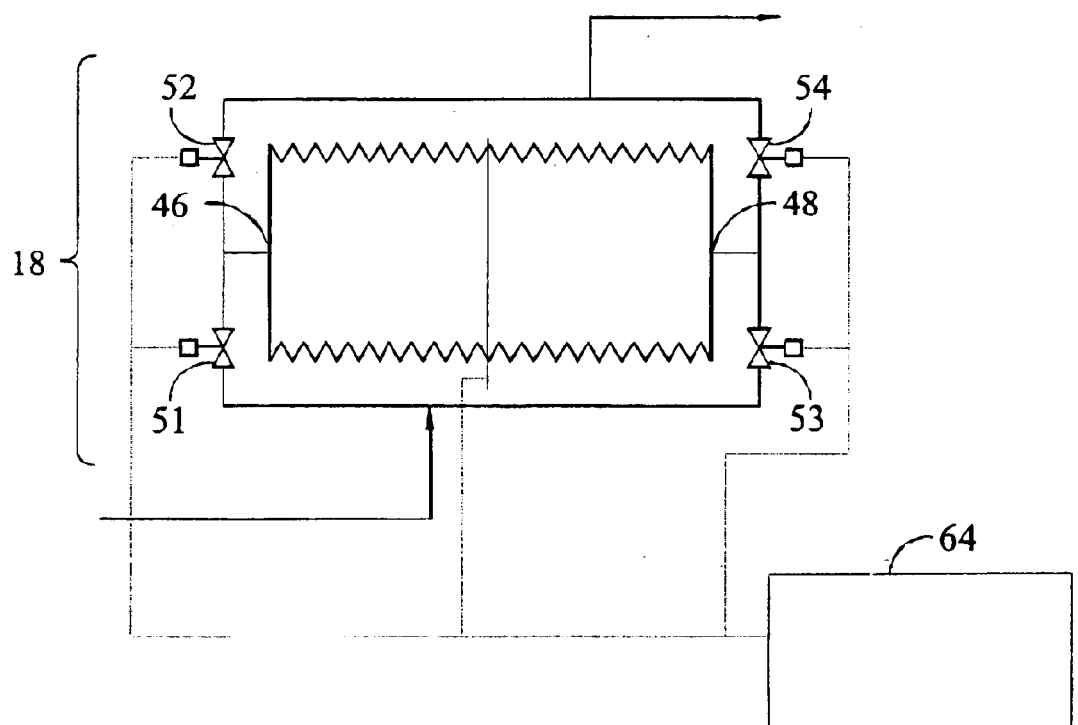
FIG. 12b is a pump flow diagram of the reciprocating pump of FIG. 12a together with associated flow lines and shutoff valves.

FIG. 12a and FIG. 12b are diagrams of an example of a reciprocating pump 18 that can be used in the practice of this invention. The design shown in these diagrams can be varied in numerous ways, such as by increasing the number of chambers to three or more, or by arranging a series of such pumps in parallel. The following discussion is directed to the particular design shown in these diagrams.

The side elevation view of FIG. 12a shows the pump housing 41, which consists of two stationary end walls 42, 43 joined by bellows-type side walls 44, 45. The bellows-type side walls 44, 45 are so-called because they are either pleated like an accordion or otherwise constructed to permit bellows-type expansion and contraction. The end walls 42, 43 and the bellows-type side walls 44, 45 together fully enclose the interior of the pump except for inlet/outlet ports on each side wall. The arrangement of these ports is shown in the pump flow diagram of FIG. 12b, the left side wall 42 having one inlet/outlet port 46, and the right side wall 43 likewise having one inlet/outlet port 48. Remotely controlled shutoff valves 51, 52, 53, 54 are placed on the external lines leading to or from each inlet/outlet port. For fail-safe operation, shutoff valves 51, 54 are normally open and shutoff valves 52, 53 are normally closed.

The movable partition 60 shown in FIG. 12a divides the pump interior into two chambers 61, 62, the partition and its connections to the remaining portions of the housing being fluid-impermeable so that the two chambers are completely separate with no fluid communication between them. The partition 60 joins the bellows-type side walls 44, 45 and moves in the two directions indicated by the two-headed arrow 63. The movement is driven by a suitable drive mechanism (not shown) capable of reciprocating movement. Many such drive mechanisms are known to those skilled in the art and can be used. In the view shown in FIG. 12a, movement of the partition to the left causes the left chamber 61 to contract and the right chamber 62 to expand. With the pump shutoff valves appropriately positioned, i.e., valves 52 and 53 open and valves 51 and 54 closed, the contracting left chamber 61 will discharge its contents through its inlet/outlet port 46 while the expanding right chamber 62 will draw gas in through its inlet/outlet port 48. Once the partition 60 has reached the end of its leftward travel, it changes direction and travels to the right and the shutoff valves are switched appropriately, causing the expanded right chamber 62 to contract and discharge its contents through its inlet/outlet port 48 while the contracted left chamber 61 expands and draws fresh gas in through its inlet/outlet port 46. In this manner, the pump as a whole produces a gas flow in a substantially continuous manner, the discharge coming alternately from the two chambers. A controller 64 governs the direction and range of motion, and the speed and cycle time of the partition 60, and coordinates the partition movement with the opening and closing of the shutoff valves 51, 52, 53, and 54. Conventional controller circuitry and components can be used.

The pump for recirculating the process gas as shown, and others within the scope of this invention, has no sliding or abrading parts or lubricant that come into contact with the process gas. Alternative pumps that meet this criterion are possible, including pumps with expandable balloon chambers, pumps with concentric pistons connected by an elastic sealing gasket, or peristaltic pumps. The pump materials, including the bellows-type walls, can thus be made of materials that are resistant or impervious to corrosion from the etchant gas. One example of such a material, useful for operating temperatures below 50° C., is stainless steel. Others are aluminum, Inconel, and Monel. Still others will be readily apparent to those experienced in handling these gases. While the capacity and dimensions of the pump and its chambers may vary, a presently preferred embodiment is one in which the change in volume of each chamber upon the movement of the partition across its full range is approximately from 0.05 to 4.2 L, though preferably from 0.1 to 1.5 L, with one example being 0.5 L. Larger chamber sizes (e.g. 5 to 20 L) are possible, which, if combined with a slower pumping speed, can benefit from lower wear on the pump. At a partition speed of one cycle every two seconds, the pump rate (for 0.5 L) will be 30 L/min. Different combinations of pump sizes and pump speeds are possible, though the preferred pump volume per time is between 7 and 150 L/min, with a preferred range of from 30 to 90 L/min.

The pump described above can be lined with a suitable lining to further reduce particulate contamination of the process gas mixture during etching. Pumps that are not of the bellows type can also be used. The preferred pumps are those that are resistant to corrosion by the process gas mixture and those that are designed to avoid introducing particulate or liquid material into the process gas mixture. Dry pumps, i.e., those that do not add exogenous purge or ballast gas into the process gas mixture, are preferred. Alternatively, the process gas could be circulated by temperature cycling (with large variations in the heating and cooling of the recirculation path).

The following is a generalized description of the etching process and its chemical parameters in relation to FIG. 11. This description is included to show the context in which the features described above are most likely to be used.

The apparatus and methods of this invention can be used in etching processes that are known in the art and in the literature. These processes include the use of dry-etch gases in general, including C12, HBr, HF, CC12F2 and others. Preferred etchant gases, particularly for etching silicon, are gaseous halides (e.g. fluorides) such as noble gas fluorides, gaseous halogen fluorides, or combinations of gases within these groups (again, preferably without energizing the gas, other than heating to cause vaporization or sublimation). The noble gases are helium, neon, argon, krypton, xenon and radon, and among these the preferred fluorides are fluorides of krypton and xenon, with xenon fluorides the most preferred. Common fluorides of these elements are krypton difluoride, xenon difluoride, xenon tetrafluoride, and xenon hexafluoride. The most commonly used noble gas fluoride in silicon etch procedures is xenon difluoride. Halogen fluorides include bromine fluoride, bromine trifluoride, bromine pentafluoride, chlorine fluoride, chlorine trifluoride, chlorine pentafluoride, iodine pentafluoride and iodine heptafluoride. Preferred among these are bromine trifluoride, bromine trichloride, and iodine pentafluoride, with bromine trifluoride and chlorine trifluoride the more preferred. Combinations of bromine trifluoride and xenon difluoride are also of interest. The etch process is generally performed at a pressure below atmospheric. It is preferred that the etchants described herein be used in the gaseous state (e.g. nonplasma) or otherwise in the absence of added energy (except heat to aid sublimation or vaporization of the starting etchant gas or liquid), and in the absence of electric fields, UV light or other electromagnetic energy, or other added fields or energy sources which would energize the etchant gas beyond it's normal energy as a gas at a particular temperature.

The etch preferably utilizes an etchant gas capable of spontaneous chemical etching of the sacrificial material at room temperature, preferably isotropic etching that chemically (and not physically) removes the sacrificial material. In a preferred embodiment, the etchant is capable at room temperature of reacting with the sacrificial material and where the reaction product(s) is a gaseous component that is released from the sacrificial material surface due to being in a gaseous state. No UV or visible light or other electromagnetic radiation or electric fields are needed, or any energy that would energize the gas molecules to physically bombard and physically remove the sacrificial material. Though the etch could be performed with the application of heat or the presence of light from the room surrounding the etch chamber, the etchant is capable of spontaneously etching the sacrificial material at room temperature without any applied heat, visible, UV or other electromagnetic radiation, ultrasonic energy, electric or magnetic fields, etc. The etchant is preferably not broken down into atoms, radicals and/or ions by an rf glow discharge, the etchant is transported by diffusion to the surface of the material being etched (in addition to pumping—e.g. by recirculating the etchant repeatedly through the etching chamber), the etchant is adsorbed on the surface, a chemical reaction occurs between the etchant and the material being etched with the formation of a volatile product, and the product is desorbed from the surface and diffuses into the bulk of the gas and eventually exits the etching chamber. The apparatus, therefore, can be without a source of RF or microwave energy, though it is possible to run the process of the invention in a plasma apparatus without energizing the etchant to form a plasma.

Taking as an example BrCl3, a molecule of BrCl3 could hypothetically be placed next to a silicon molecule bound to other silicon molecules in crystalline silicon, polysilicon or in an amorphous silicon matrix. The bond energies of the Cl atoms to the Br atoms are sufficiently weak, and the bond energy of the silicon atom to other silicon atoms is sufficiently weak, and the attraction forces between Si and Cl are sufficiently strong, that without a physical bombardment of the BrCl3 on the silicon, Cl will disassociate from Br and bond to Si to form various products such as SiCl, SiCl2, SiCl3, SiCl4, etc., which etch products are a gas a room temperature and dissipate from the silicon surface, thus removing sacrificial silicon material. The same process occurs with XeF2, BrF3 and the other vapor phase spontaneous chemical etchants.

Such chemical etching and apparatus for performing such chemical etching are disclosed in U.S. patent application Ser. No. 09/427,841 to Patel et al. filed Oct. 26, 1999, in U.S. patent application Ser. No. 09/649,569 to Patel at al. filed Aug. 28, 2000, mentioned previously, and in U.S. patent application Ser. No. 60/293,092 to Patel et al. filed May 22, 2001 incorporated herein by reference. Preferred etchants for the etch are gas phase fluoride etchants that, except for the optional application of temperature, are not energized. Examples include gaseous acid etchants (HF, HCl, HI etc.), noble gas halides such as XeF2, XeF6, KrF2, KrF4 and KrF6, and interhalogens such as IF5, BrCl3, BrF3, IF7 and ClF3. It is also possible to use fluorine gas, though handling of fluorine gas makes this a less desirable option. The etch may comprise additional gas components such as N2 or an inert gas (Ar, Xe, He, etc.). In the etching process, except for optional heating, the gas is not energized and chemically etches the sacrificial material isotropically. In this way, the sacrificial material is removed and the micromechanical structure is released. In one aspect of such an embodiment, BrF3 and/or XeF2 are provided in a chamber with diluent (e.g. N2 and He). An initial plasma etch, preferably in a separate etching apparatus, can be performed prior to etching as set forth above. This sequential etch is set forth further in U.S. patent application Ser. No. 60/293,092 to Patel et al. filed May 22, 2001, the subject matter of which is incorporated herein by reference.

Figure 13:
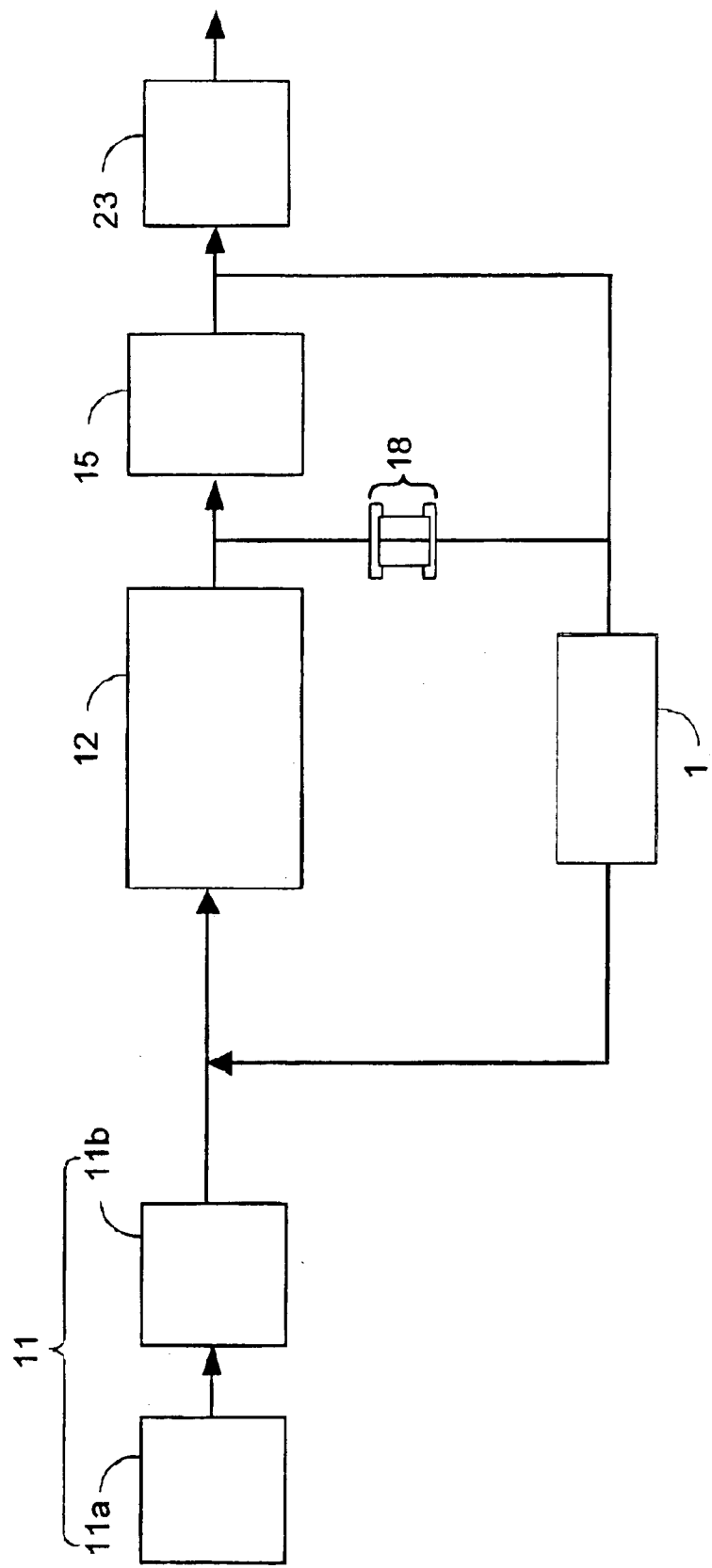
FIG. 13 is another exemplary etching system used in the embodiment of the invention.

While the source chamber 11 can be a single chamber, the arrangement shown in FIG. 13 is an optional one in which the source chamber is actually a pair of chambers 11a and 11b arranged in series. The first of these chambers 11a contains the source material primarily in its condensed form, i.e., either as crystals to be sublimated or liquid to be vaporized. The second chamber 11b receives the source material gas evolved by sublimation from the crystals or by vaporization from the liquid in the first chamber 11a. To maintain these phases, the two chambers 11a and 11b will preferably be maintained at different temperatures (preferably at least 5 degrees C. difference), the former 11a at the lower temperature to keep the material in its condensed form (solid crystals or liquid) and the latter 11b at the higher temperature (and possibly a higher pressure as well) to keep the material in the vapor form (and to avoid the problem of condensation) at a pressure sufficiently high to allow it to be supplied to the succeeding chambers at the pressures needed in those chambers. In one embodiment, the two chambers are held at temperatures above room temperature, with chamber 11b held at a temperature from 2 to 24 degrees C. (preferably around 5 to 10 degrees C.) higher than the temperature of chamber 11a. Such a two-chamber embodiment could likewise be utilized in a system such as that illustrated in FIG. 10. Chambers 11a and 11b could also be arranged in parallel.

The terms "sample" and "microstructure" are used herein to denote the article from which a material is sought to be removed or to which a material is to be added, whether the material forms a layer among a plurality of layers, layers among a plurality of layers or a region adjacent to other regions in the same plane. The "sample" may thus be a single mirror element and its associated layers of other materials, a test pattern, a die, a device, a wafer, a portion of a wafer, or any article from which a portion is to be removed or added. The invention is particularly suitable for processes where the size of the portion of material that is being added or removed is less than 5 mm in at least one of its dimensions, preferably less than 1 mm, more preferably less than 500 $\mu$m, and most preferably less than 100 $\mu$m. The invention is also well suited to adding or removing material (e.g., in the form of holes or layers) in a submicron environment (e.g. in the range of 10 nm to less than 1000 nm) (as sometimes needed, for example, in MEMS and MOEMS).

In the system depicted in the drawings, as well as other systems within the scope of this invention, a single charge of etchant can be placed in the source chamber or the expansion chamber, then released (with or without diluents) into the recirculation loop. Additional etchant can be introduced to replenish the circulating stream as the amount of etchant in the recirculation loop decreases over time. Other variations of the process will be apparent to those skilled in the art.

When the material to be removed by etching is silicon, certain etching processes supply the etchant gas as a mixture of gases of which one component is the etchant gas itself (or a mixture of etchant gases) while other components are non-etchant diluents. Whether the gas consists entirely of etchant gas(es) or contains non-etchant components as well, the rate of the etch reaction may vary with the partial pressure of the etchant gas. The partial pressure may vary, but in most applications, particularly those in which silicon is being etched, best results will be obtained with the etchant gas at a partial pressure of at least about 0.01 mbar (0.0075 torr), preferably at least 0.1 Torr, more preferably within the range of from about 1 to 760 Torr, and most preferably from about 50 to 600 Torr. These pressure ranges are particularly applicable to xenon difluoride etching.

In certain processes, non-etchant gas additive(s) are included to increase the selectivity of the silicon etch. Preferred additives for this purpose are non-halogen-containing gases. A single such additive or a mixture of such additives can be used. In preferred embodiments of this invention, the additives are those whose molar-averaged formula weight (expressed in daltons or grams per mole) is less than the formula weight of molecular nitrogen, preferably about 25 or less, still more preferably within the range of from about 4 to about 25, still more preferably within the range of from about 4 to about 20, and most preferably within the range of from about 4 to about 10. If a single additive species is used, the "molar-averaged formula weight" is the actual formula weight of that species, whereas if two or more additive species are used in the same gas mixture, the molar-averaged formula weight is the average of the formula weights of each species in the mixture (exclusive of the noble gas fluoride) calculated on the basis of the relative molar amounts (approximately equal to the partial pressures) of each species. In terms of thermal conductivity, preferred additives are those whose thermal conductivity at 300 K (26.9° C.) and atmospheric pressure ranges from about 10 mW/(m K) (i.e., milliwatts per meter per degree Kelvin) to about 200 mW/(m K), and most preferably from about 140 mW/(m K) to about 190 mW/(m K). In general, the higher the thermal conductivity of the additive, the greater the improvement in selectivity. Examples of additives suitable for use in this invention are nitrogen (N2, thermal conductivity at 300 K: 26 mW/(m K)), argon (Ar, thermal conductivity at 300 K: 18 mW/(m K)), helium (He, thermal conductivity at 300 K: 160 mW/(m K)), neon (Ne, thermal conductivity at 300 K: 50 mW/(m K)), and mixtures of two or more of these gases. Preferred additive gases are helium, neon, mixtures of helium and neon, or mixtures of one or both of these with one or more non-etchant gases of higher formula weight such as nitrogen and argon. Particularly preferred additives are helium and mixtures of helium with either nitrogen or argon.

The degree of selectivity improvement may vary with molar ratio of the additive to the etchant gas. Here again, the molar ratio is approximately equal to the ratio of the partial pressures, and in this case the term "molar ratio" denotes the ratio of the total number of moles of the additive gas (which may be more than one species) divided by the total number of moles of the etchant gas (which may also be more than one species). In most cases, best results will be obtained with a molar ratio of additive to etchant that is less than about 500:1, preferably within the range of from about 1:1 to about 500:1, preferably from about 10:1 to about 200:1, and most preferably from about 20:1 to about 150:1. In one example, the ratio is set at 125:1.

The temperature at which the etch process is conducted can likewise vary, although the partial pressure of the etchant gas will vary with temperature. The optimal temperature may depend on the choice of etchant gas, gaseous additive or both. In general, and particularly for procedures using xenon difluoride as the etchant gas, suitable temperatures will range from about −60° C. to about 120° C., preferably from about −20° C. to about 80° C., and most preferably from about 0° C. to about 60° C. For xenon difluoride, the silicon etch rate is inversely proportional to the temperature over the range of −230° C. to 60° C. The improvement in selectivity can thus be further increased by lowering the etch process temperature.

The flow parameters will be selected such that the time during which the sample will be exposed to the etchant gas will be sufficient to remove all or substantially all of the silicon. By "silicon" it is meant any type of silicon, including amorphous silicon, single crystal silicon and polysilicon, which silicon can have up to 40 at % or more (typically from 5 to 25 at %) hydrogen depending upon the deposition technique, as well as impurities that can result from the target or atmosphere. The expression "substantially all of the silicon" is used herein to denote any amount sufficient to permit the finished product to function essentially as effectively as if all of the silicon had been removed. An example of the structures to which this invention will be applied is that depicted in U.S. Pat. No. 5,835,256, in which a silicon nitride layer is deposited over a polysilicon layer, and the silicon nitride layer is patterned to leave vias that define the lateral edges of the mirror elements. Access to the sacrificial polysilicon layer is through the vias, and the etching process removes the polysilicon below the vias by etching in the vertical direction (i.e., normal to the planes of the layers) while also removing the polysilicon underneath the silicon nitride by etching in the lateral direction (parallel to the planes of the layers). The process is also effective for etching silicon relative to multiple non-silicon layers. Also, it should be noted that the silicon can contain impurities, and in particular may contain a large amount of hydrogen (e.g. up to 25 at % or more) depending upon the deposition method used.

It will be appreciated by those of skill in the art that a new and useful method for fabricating microelectromechanical devices has been described herein. In view of the many possible embodiments to which the principles of this invention may be applied, however, it should be recognized that the embodiments described herein with respect to the drawing figures are meant to be illustrative only and should not be taken as limiting the scope of invention. For example, those of skill in the art will recognize that the illustrated embodiments can be modified in arrangement and detail without departing from the spirit of the invention. In particular, heating may be applied during releasing the micromirror device. For another example, the Sandia SUMMiT process (using polysilicon for structural layers) or the Cronos MUMPS process (also polysilicon for structural layers) could be used in the present invention. Also, a MOSIS process (AMI ABN −1.5 um CMOS process) could be adapted for the present invention. Also, the sacrificial layer and etchant disclosed herein are exemplary only. Also, though PVD and CVD are referred to above, other thin film deposition methods could be used for depositing the layers, including spin-on, sputtering, anodization, oxidation, electroplating and evaporation. Therefore, the invention as described herein contemplates all such embodiments as may come within the scope of the following claims and equivalents thereof.

We claim:

1. A method comprising:
providing a substrate;
depositing a sacrificial layer on the substrate, wherein the sacrificial layer comprises an early transition metal;
forming a hinge and a mirror plate of a micromirror device after the sacrificial layer, wherein the hinge comprise an early transition metal nitride and a metalloid nitride;
removing the sacrificial layer using a vapor phase etchant that is a vapor phase noble gas halide or a vapor phase interhalogen so as to release the micromirror device.

2. The method of claim 1, wherein the sacrificial layer comprises an early transition metal element, an early transition metal alloy or an early transition metal silicide.

3. The method of claim 2, wherein the early transition metal element is selected from the group consisting of Ti, Zr, Hf, and Rf.

4. The method of claim 3, wherein the early transition metal element is titanium.

5. The method of claim 2 wherein the early transition metal element is selected from the group consisting of V, Nb, Ta, and Db.

6. The method of claim 5, wherein the early transition metal element is tantalum.

7. The method of claim 2, wherein the early transition metal element is selected from the group consisting of Cr, Mo, W, and Sg.

8. The method of claim 7, wherein the early transition metal element is molybdenum.

9. The method of claim 7, wherein the early transition metal element is tungsten.

10. The method of claim 2, wherein the early transition metal alloy comprises an early transition metal element selected from the group consisting of Ti, Zr, Hf, and Rf.

11. The method of claim 10, wherein the early transition metal element is titanium.

12. The method of claim 2, wherein the early transition metal alloy comprises an early transition metal element selected from the group consisting of V, Nb, Ta, and Db.

13. The method of claim 12, wherein the early transition metal element is tantalum.

14. The method of claim 2, wherein the early transition metal alloy comprises an early transition metal element selected from the group consisting of Cr, Mo, W. and Sg.

15. The method of claim 14, wherein the early transition metal element is molybdenum.

16. The method of claim 14, wherein the early transition metal element is tungsten.

17. The method of claim 2, wherein the early transition metal suicide comprises an early transition metal element selected from the group consisting of Ti, Zr, Hf, and Rf.

18. The method of claim 17, wherein the early transition metal element is titanium.

19. The method of claim 2, wherein the early transition metal silicide comprises an early transition metal element selected from the group consisting of V, Nb, Ta, and Db.

20. The method of claim 19, wherein the early transition metal element is tantalum.

21. The method of claim 2, wherein the early transition metal suicide comprises an early transition metal element selected from the group consisting of Cr, Mo, W, and Sg.

22. The method of claim 21, wherein the early transition metal element is tungsten.

23. The method of claim 21, wherein the early transition metal element is molybdenum.

24. The method of claim 1 wherein the sacrificial layer comprises one or more early transition metals selected from zirconium, hafnium, vanadium, niobium, chromium.

25. The method of claim 1, wherein the chemical vapor-phase etchant is a mixture of noble gas halide and one or more non-etchant gaseous additives.

26. The method of claim 25, wherein the additive is inert gas.

27. The method of claim 1 wherein the step of forming a hinge and a mirror plate of the micromirror device further comprises:
depositing a second sacrificial layer; and
forming one or more other structures of the micromirror device on the second sacrificial layer.

28. The method of claim 27, wherein the second sacrificial layer comprises one or more sacrificial materials selected from early transition metal element, early transition metal alloy and early transition metal suicide; and wherein the step of removing the sacrificial layer for releasing the microelectromechanical device further comprises: removing the second sacrificial layer.

29. The method of claim 1, wherein the step of forming a hinge and a mirror plate of the micromirror device further comprises:
depositing a barrier layer on one or both of the formed hinge and mirror plate of the micromirror device; and
patterning the deposited barrier layer.

30. The method of claim 29, wherein the barrier layer comprises one or more barrier materials selected from early transition metal nitride, early transition metal compound, early transition metal oxide and early transition metal nitride oxide.

31. The method of claim 29, further comprising:
depositing an amorphous silicon layer on the barrier layer, wherein the amorphous silicon layer is removed after releasing the micromirror device.

32. The method of claim 1 wherein the substrate is glass that is transparent to visible light.

33. The method of claim 1 wherein the substrate is a silicon wafer, on which digital integrated circuit and electrode can be formed.

34. The method of claim 27, wherein the micromirror device is part of a spatial light modulator used in a display system.

35. The method of claim 1, further comprising:
depositing another sacrificial layer, wherein the mirror plate s formed on said sacrificial layer; and the hinge is formed said another sacrificial layer.

36. The method of claim 35, wherein the hinge is formed prior to the mirror plate.

37. The method of claim 35, wherein the hinge is formed after the mirror plate.

38. The method of claim 1, wherein the hinge and mirror arc formed on the same sacrificial layer.

39. The method of claim 1, wherein the hinge is a multi-layered structure; and the early transition metal nitride and the metalloid nitride are located in different planes.

40. The method of claim 39, wherein the early transition metal nitride is $TiN_R$ or $TiSi_xN_x$.

41. The method of claim 39, wherein the hinge comprises $SiN_x$.

42. The method of claim 1, wherein the hinge comprises $TiSi_xN_y$.

43. The method of claim 1, wherein the hinge further comprises an early transition metal silicon nitride.

44. The method of claim 1, wherein the hinge further comprises a early transition metal oxynitride.

45. The method of claim 1, wherein the hinge further comprises an early transition metal silicon oxynitride.

46. The method of claim 1, wherein the hinge further comprises a silicon carbide.

47. The method of claim 1, wherein the mirror plate comprises an aluminum.

48. The method of claim 1, wherein the mirror plate comprises a titanium.

49. The method of claim 1, wherein the mirror plate comprises a silver.

50. The method of claim 1, wherein the mirror plate comprises a gold.

51. The method of claim 1, wherein the structure layers further comprise aluminum titanium.

52. The method of claim 1, wherein the mirror plate comprises an aluminum silicon.

53. The method of claim 1, wherein the mirror plate comprises an aluminum silicon copper.

* * * * *